(12) United States Patent
Sakagami

(10) Patent No.: US 6,281,050 B1
(45) Date of Patent: Aug. 28, 2001

(54) MANUFACTURING METHOD OF A SEMICONDUCTOR DEVICE AND A NONVOLATILE SEMICONDUCTOR STORAGE DEVICE

(75) Inventor: Eiji Sakagami, Yokkaichi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/521,969

(22) Filed: Mar. 9, 2000

(30) Foreign Application Priority Data

Mar. 15, 1999 (JP) .................................... 11-068017
Aug. 30, 1999 (JP) .................................... 11-244018

(51) Int. Cl.⁷ ...................... H01L 21/335; H01L 21/8232
(52) U.S. Cl. ........................................... 438/142; 438/201
(58) Field of Search .................................... 438/201, 142, 438/197, 258, 259, 266, 587, 589

(56) References Cited

U.S. PATENT DOCUMENTS 5,578,518  11/1996  Koike et al. .
5,960,297   9/1999  Saki .
6,034,894 *  3/2000  Maruyama et al. ............ 365/185.17

* cited by examiner

Primary Examiner—David Nelms
Assistant Examiner—David Nhu
(74) Attorney, Agent, or Firm—Oblon, Spivak, McClelland, Maier & Neustadt, P.C.

(57) ABSTRACT

A nitride film (14A) as a had pattern mask in a peripheral transistor forming region and a cell transistor forming region is narrowed by A1 into a narrower nitride film (14B) by pull-back. While the narrower oxide film (14B) in the cell transistor forming region is covered by an oxide film (22), the narrower nitride film (14B) in the peripheral transistor forming region is further narrowed by A2 into a still narrower nitride film (14C) by pull-back. By making apertures (28A, 28B) in a buried oxide film (28) by using the narrower nitride film (14B) and the still narrower nitride film (14C), STI edges made of the buried oxide film (28) can be prevented from depressing or falling down.

11 Claims, 31 Drawing Sheets

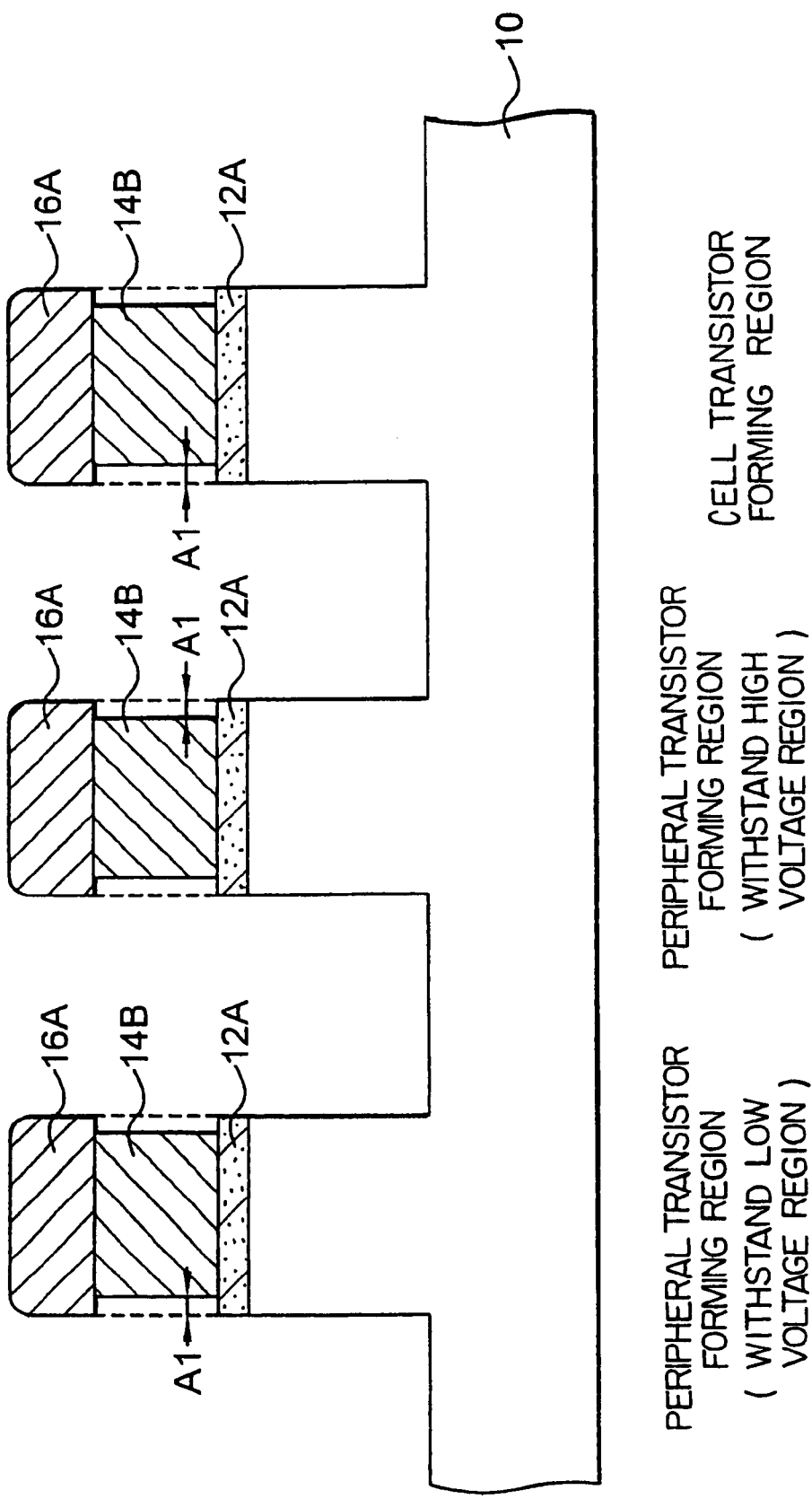
F I G. 3

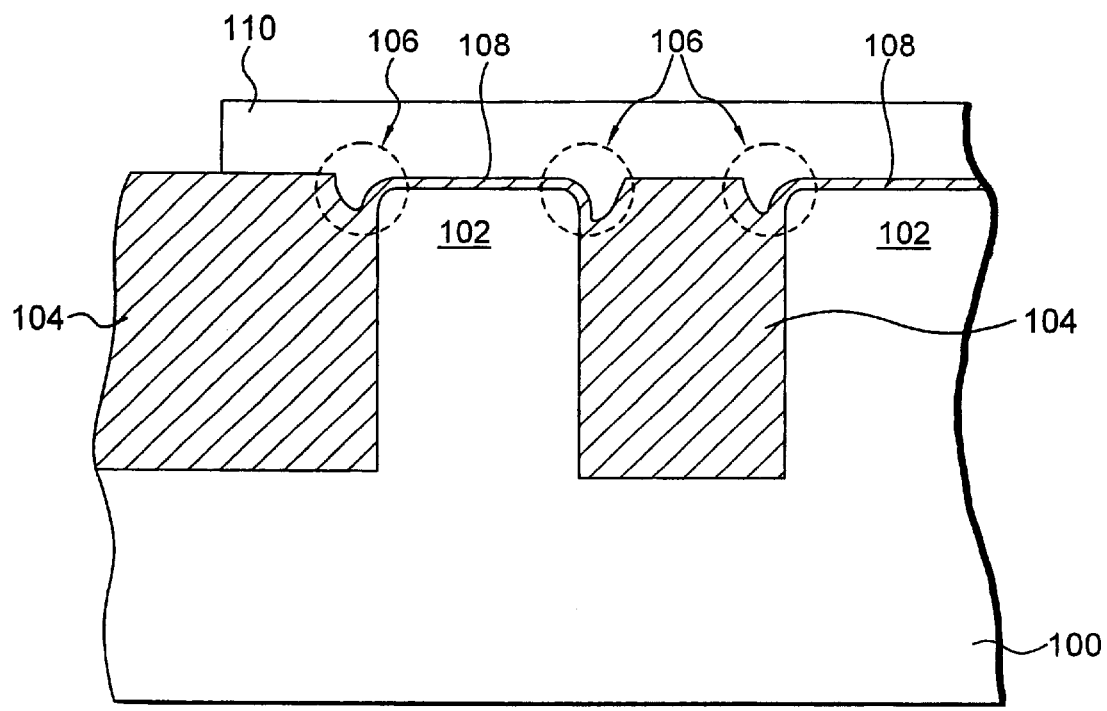
F I G. 12
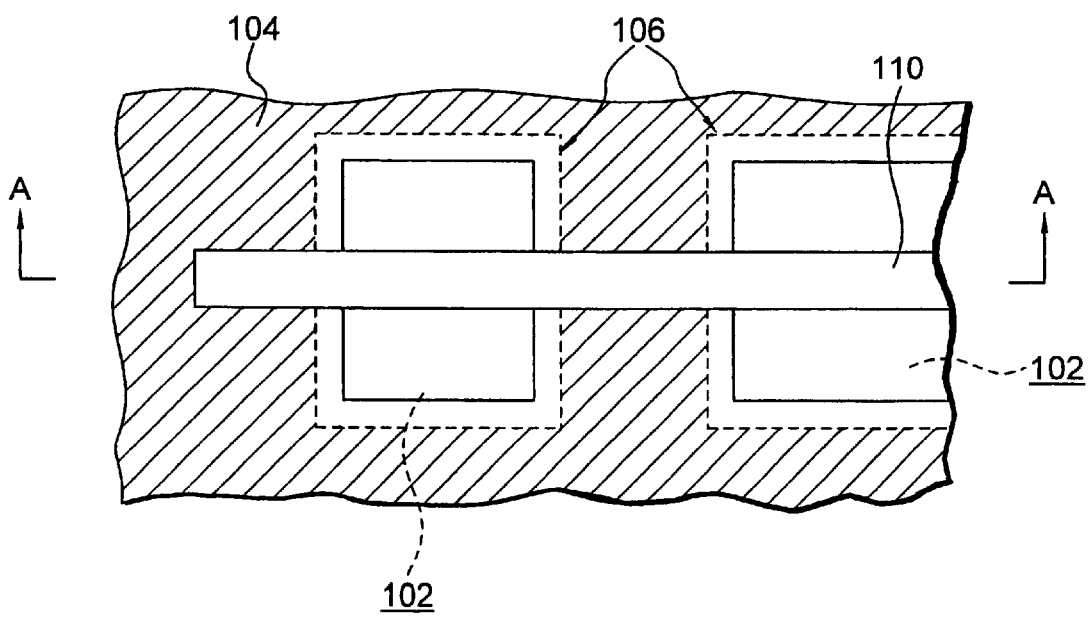
F I G. 13

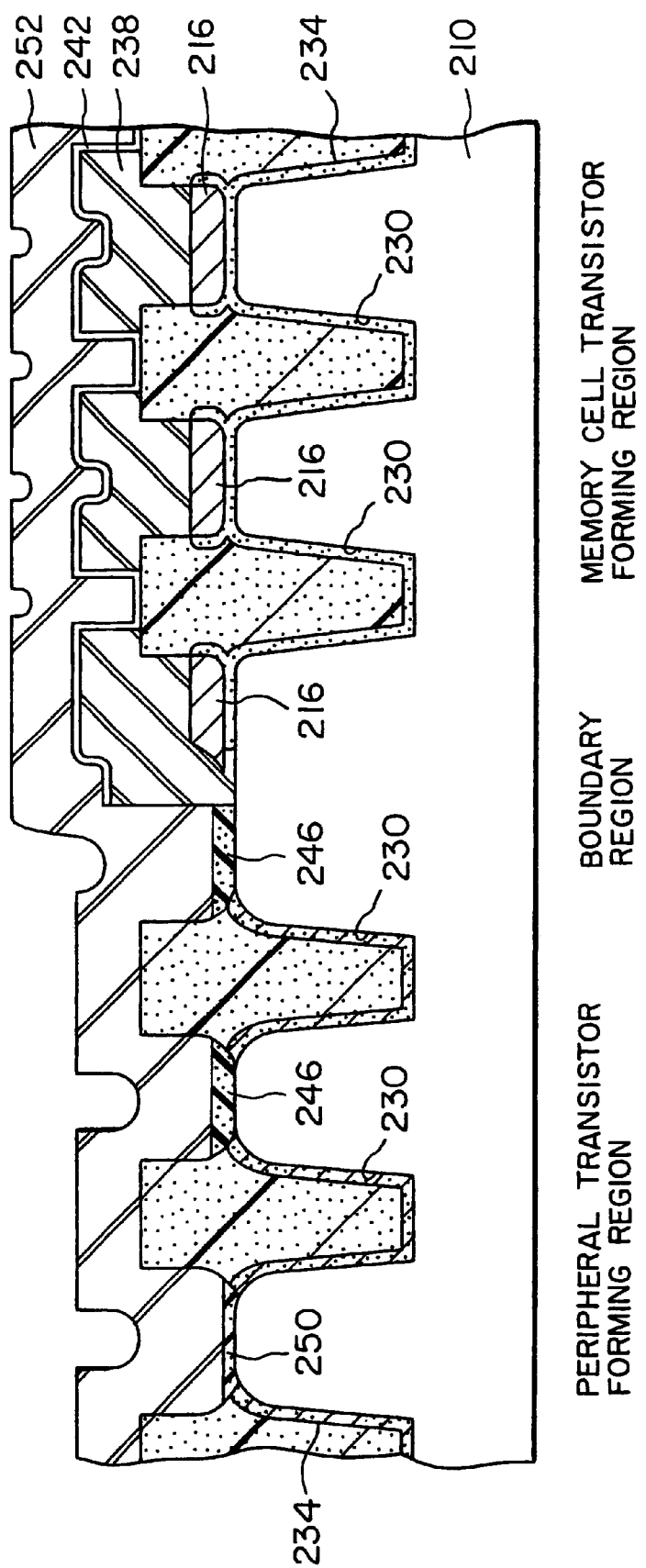
F I G. 31

MANUFACTURING METHOD OF A SEMICONDUCTOR DEVICE AND A NONVOLATILE SEMICONDUCTOR STORAGE DEVICE

RELATED APPLICATION

This application claims benefit of priority under 35 U.S.C. §119 to Japanese Patent Applications No. H11-68017, filed on Mar. 15, 1999, and No. H11-244018, filed on Aug. 30, 1999, the entire contents of which are incorporated by reference herein.

BACKGROUND OF THE INVENTION

1. Field of the Invention

This invention relates to a manufacturing method of a semiconductor device and a nonvolatile semiconductor storage device, and more particularly, to a manufacturing method of those devices which use STI (shallow trench isolation) for isolation of elements.

2. Description of the Related Art

Recently, isolation of elements by SA-STI (self-aligned shallow trench isolation) has come be employed in place of conventional LOCOS methods as a method for isolation of elements required for miniaturization of semiconductor devices. One of problems with isolation of elements using STI is the nonvolatile semiconductor storage device which needs to generate a high potential for effecting erase/program(write) operations using a tunnel oxide film.

The nonvolatile semiconductor storage device needs, in addition to a memory cell transistor requiring a tunnel oxide film, a transistor with a thick gate oxide film for generating a high potential (high voltage-withstanding transistor) and a thin gate oxide film for effecting low-power, low-voltage operations (low voltage-withstanding transistor). That is, it needs three kinds of transistors: memory cell transistor, high voltage-withstanding transistor, low voltage-withstanding transistor. For making these three kinds of transistors, thickness of the oxide film of the low voltage-withstanding transistor is the thinnest, thickness of the tunnel oxide film of the memory cell transistor is the next, and thickness of the oxide film of the high voltage-withstanding transistor is the thickest. On the other hand, thickness of the tunnel oxide film of the memory cell transistor may be the thinnest, thickness of the oxide film of the low voltage-withstanding transistor may be the next, and thickness of the oxide film of the high voltage-withstanding transistor may be the thickest.

In these nonvolatile semiconductor storage devices requiring differentiation in thickness among a plurality of gate oxide films, deterioration of the transistor performance by depression of STI arises as a problem. FIG. 12 is a cross-sectional view of a nonvolatile semiconductor storage device under its manufacturing process, taken to explain depression of STI, and FIG. 13 is a plane view taken from the top of FIG. 12. That is, FIG. 12 is a cross-sectional view taken along the A—A line of FIG. 13. These FIGS. 12 and 13 illustrate a MOS transistor.

As shown in FIGS. 12 and 13, depressions 106 appear in STI regions 104. The depressions 106 in the STI regions 104 are caused by a film decrease in the STI regions 104 upon oxide film etching conducted for forming an oxide film different in thickness from the gate oxide film 108 in the active regions 102 of the semiconductor substrate 100. When the film decrease occurs, surfaces of the STI regions 104 in the perimeter portions sink into the semiconductor substrate 100 from the surface level of the active region 102.

As shown in FIG. 13, once the depressions 106 are produced at perimeter portions of the STI regions 104 to surround the active regions 102, as shown in FIG. 12, gate electrodes 110 also sink into the depressions 106. When the gate electrodes 110 sink, the depressed perimeter regions are affected by side surface portions of the active regions 102, and invite the anomaly that kinks occur in sub-threshold regions of MOS transistors. FIG. 14 is a diagram which shows relationship between the gate voltage Vg and log Id of the source/drain current Id of a transistor including kinks.

As shown in FIG. 14, when kinks occur, the cut-off property of the MOS transistor deteriorates, and the off leakage current increases. This invites various problems such as instability of the circuit operation, increase of power consumption in the standby mode.

SUMMARY OF THE INVENTION

It is therefore an object of the invention to prevent that depressions are produced in STI perimeter regions in a semiconductor device having STI when a plurality of oxide films different in thickness are formed. Additionally, thereby, the invention intends to prevent an increase of the off leakage current by improving the cut-off property of a MOS transistor. That is, it is the object of the invention to provide a semiconductor device and a nonvolatile semiconductor storage device having a MOS transistor which is stable in circuit operation and reduced in power consumption in the standby mode.

According to the invention, there is provided a manufacturing method of a semiconductor device comprising the steps of:

making on a semiconductor substrate a first pattern mask having an aperture in a trench isolation forming region;

making an isolation aperture in the semiconductor substrate by using the first pattern mask;

narrowing the width of the first pattern mask to form a second pattern mask having a first mask with a first width and a second mask with a second width narrower than the first width;

forming a buried insulating film which buries the isolation aperture and extends onto the pattern mask;

removing the second pattern mask, then making a first aperture with the first width in a portion of the buried insulating film from which the first mask has been removed, and making a second aperture with the second width in a portion of the buried insulating film from which the second mask has been removed;

forming a first insulating film with a first thickness on the bottom surface of the first aperture and the bottom surface of the second aperture;

removing the first insulating film formed on the bottom surface of the second aperture while maintaining the first insulating film formed on the bottom surface of the first aperture; and forming a second insulating film different in thickness from the first insulating film on the bottom surface of the second aperture.

According to the invention, there is further provided a manufacturing method of a nonvolatile semiconductor storage device including a memory cell transistor forming region for forming a memory cell transistor, and a peripheral transistor forming region for forming a peripheral transistor for the memory cell transistor, comprising the steps of:

making on a semiconductor substrate a first pattern mask having an aperture in a trench isolation forming region;

making an isolation aperture in the semiconductor substrate by using the first pattern mask;

narrowing the width of the first pattern mask to form a second pattern mask having a first mask with a first width in the memory cell transistor forming region and a second mask with a second width narrower than the first width in the peripheral transistor forming region;

forming a buried insulating film which buries the isolation aperture and extends onto the pattern mask;

removing the second pattern mask, then making a first aperture with the first width in a portion of the buried insulating film located in the memory cell transistor forming region, from which the first mask has been removed, and making a second aperture with the second width in a portion of the buried insulating film located in the peripheral transistor forming region, from which the second mask has been removed;

forming a first insulating film with a first thickness on the bottom surface of the first aperture located in the memory cell transistor forming region and the bottom surface of the second aperture located in the peripheral transistor forming region;

removing the first insulating film formed on the bottom surface of the second aperture located in the peripheral transistor forming region while maintaining the first insulating film formed on the bottom surface of the first aperture located in the memory cell transistor forming region;

forming a second insulating film different in thickness from the first insulating film on the bottom surface of the second aperture located in the peripheral transistor forming region;

removing the second insulating film formed on the bottom surface of the second aperture located in a low voltage-withstanding transistor forming region of the peripheral transistor forming region for forming a low voltage-withstanding transistor while maintaining the first insulating film formed on the bottom surface of the first aperture located in the memory cell transistor forming region and the second insulating film formed on the bottom surface of the second aperture located in a high voltage-withstanding transistor forming region of the peripheral transistor forming region for forming a high voltage-withstanding transistor; and forming a third insulating film on the bottom surface of the second aperture located in the low voltage-withstanding transistor forming region, the third insulating film having a thickness different from the thickness of the first insulating film and different from the thickness of the second insulating film located in the high voltage-withstanding transistor forming region.

According to the invention, there is further provided a manufacturing method of a semiconductor device comprising the steps of:

forming a first oxide film on a semiconductor substrate;

making apertures in a trench isolation forming region in the first oxide film and a surface side of the semiconductor substrate to use the surface portion of the semiconductor substrate located between the apertures as an active region;

conducting rounding oxidation of the semiconductor substrate to make bird's beaks bite into portions of the first oxide film on the active region;

burying the apertures in each trench isolation forming region with a buried oxide film to form trench isolation; and removing the first oxide film from the active region.

According to the invention, there is further provided a manufacturing method of a nonvolatile semiconductor storage device including a memory cell transistor forming region for forming a memory cell transistor, and a peripheral transistor forming region for forming a peripheral transistor for the memory cell transistor, comprising the steps of:

forming a tunnel oxide film on a semiconductor substrate in the memory transistor forming region;

forming a first oxide film on the semiconductor substrate in the peripheral transistor forming region;

making an aperture in each trench isolation forming region in the tunnel oxide film, first oxide film and a surface side of the semiconductor substrate to use the surface side of the semiconductor substrate located between the apertures as an active;

conducting rounding oxidation of the semiconductor substrate to make bird's beaks which bite at least into the first oxide film portion located in the active region;

burying a buried oxide film in the aperture in each trench isolation forming region in the memory cell transistor forming region and the peripheral transistor forming region to make trench isolation; and removing the first oxide film from the active region in the peripheral transistor forming region.

BRIEF DESCRIPTION OF THE DRAWINGS

FIG. 3 is a cross-sectional partial view of the nonvolatile semiconductor storage device under the manufacturing process according to the first embodiment of the invention;

FIG. 12 is a cross-sectional view which shows an aspect including depressions at STI edges in a conventional transistor (taken along the A—A line of FIG. 13);

FIG. 13 is a plan view showing an aspect including the depressions at the STI edges in the conventional transistor (taken from the top of FIG. 12);

FIG. 31 is a cross-sectional partial view of the nonvolatile semiconductor storage device under the manufacturing process according to the second embodiment of the invention.

DETAILED DESCRIPTION OF THE PREFERRED EMBODIMENTS

<First Embodiment>

The first embodiment of the invention is directed to a semiconductor device in which oxide films different in thickness should be made by using STI for element isolation, and it is configured to control the pull-back amount of a nitride film as a mask in the process for making STI independently for the cell transistor forming region and the peripheral transistor forming region in order to prevent falling or depression of the oxide films which might occur in STI perimeter regions while making the oxide films different in thickness. The first embodiment of the invention is explained below taking a nonvolatile semiconductor storage device as an example.

FIGS. 1 through 11 are cross-sectional views of the nonvolatile semiconductor storage device under different steps of a manufacturing process according to the embodiment.

Figure 1:
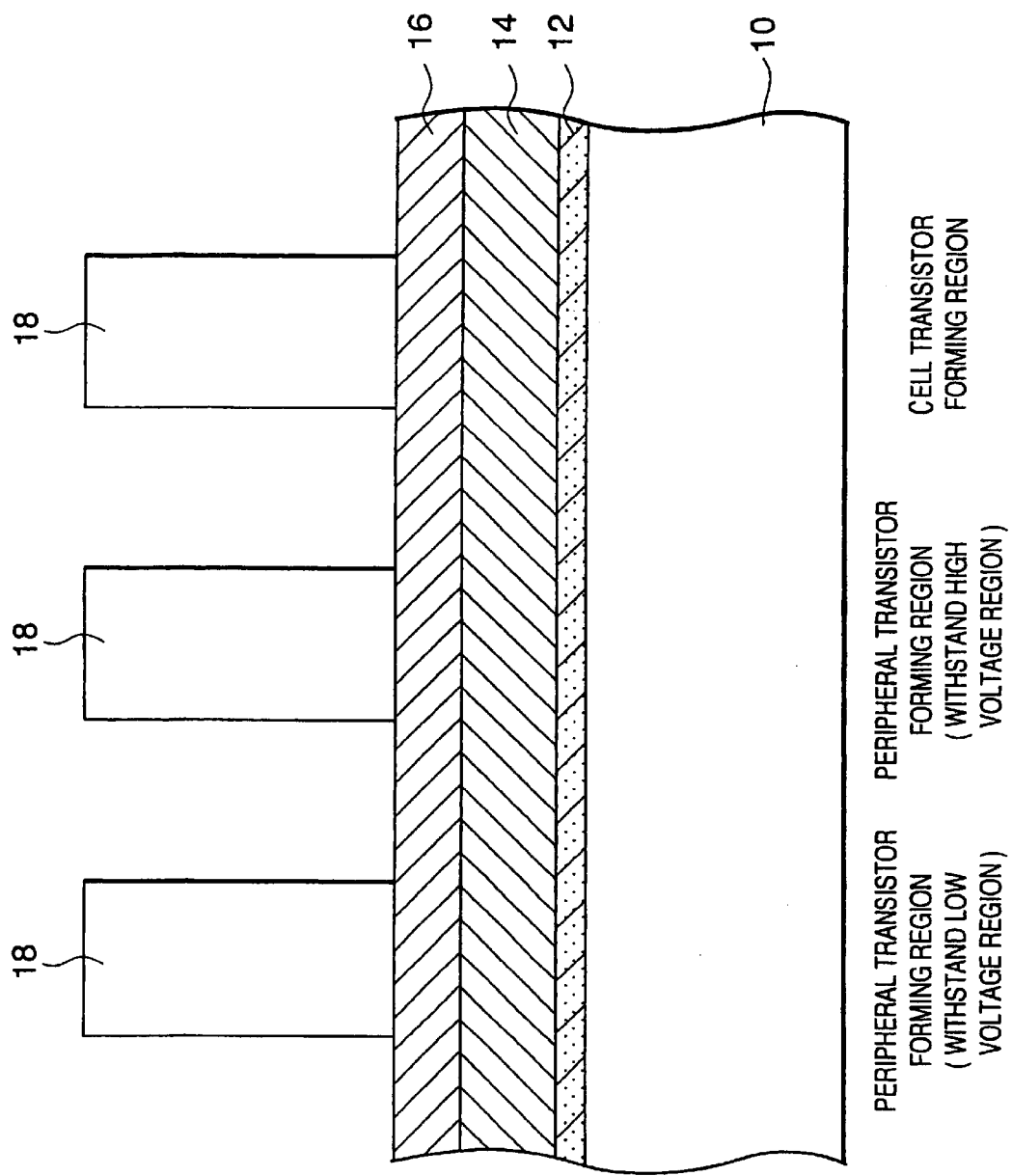
FIG. 1 is a cross-sectional partial view of a nonvolatile semiconductor storage device under a manufacturing process according to the first embodiment of the invention.

First as shown in FIG. 1, a pad oxide film 12 is formed on one surface of a semiconductor substrate 10 by thermal oxidation, for example. In this embodiment, the semiconductor substrate 10 is a silicon substrate, and the pad oxide film 12 is stacked up to the thickness of 1 nm through 25 nm. This pad oxide film 12 has the role of preventing the surface of the semiconductor substrate 10 from being directly nitrified by diffusion of nitrogen from a nitride film 14 used as a mask for STI processing in a later step.

After that, the nitride film 14 and an oxide film are formed on the pad oxide film 12 by CVD (chemical vapor deposition), for example. In this embodiment, the nitride film 14 is stacked up to the thickness of 100 nm through 200 nm. The oxide film 16 is staked up to the thickness of 100 nm through 200 nm by CVD using a TEOS (tetraethylorthosilicate, $Si(OC_2H_5)_4$) or $SiH_4$. Thereafter, a photoresist mask 18 for patterning an active region is formed by photolithography. As a result, the photoresist mask 18 having openings in STI forming regions is obtained.

Figure 2:
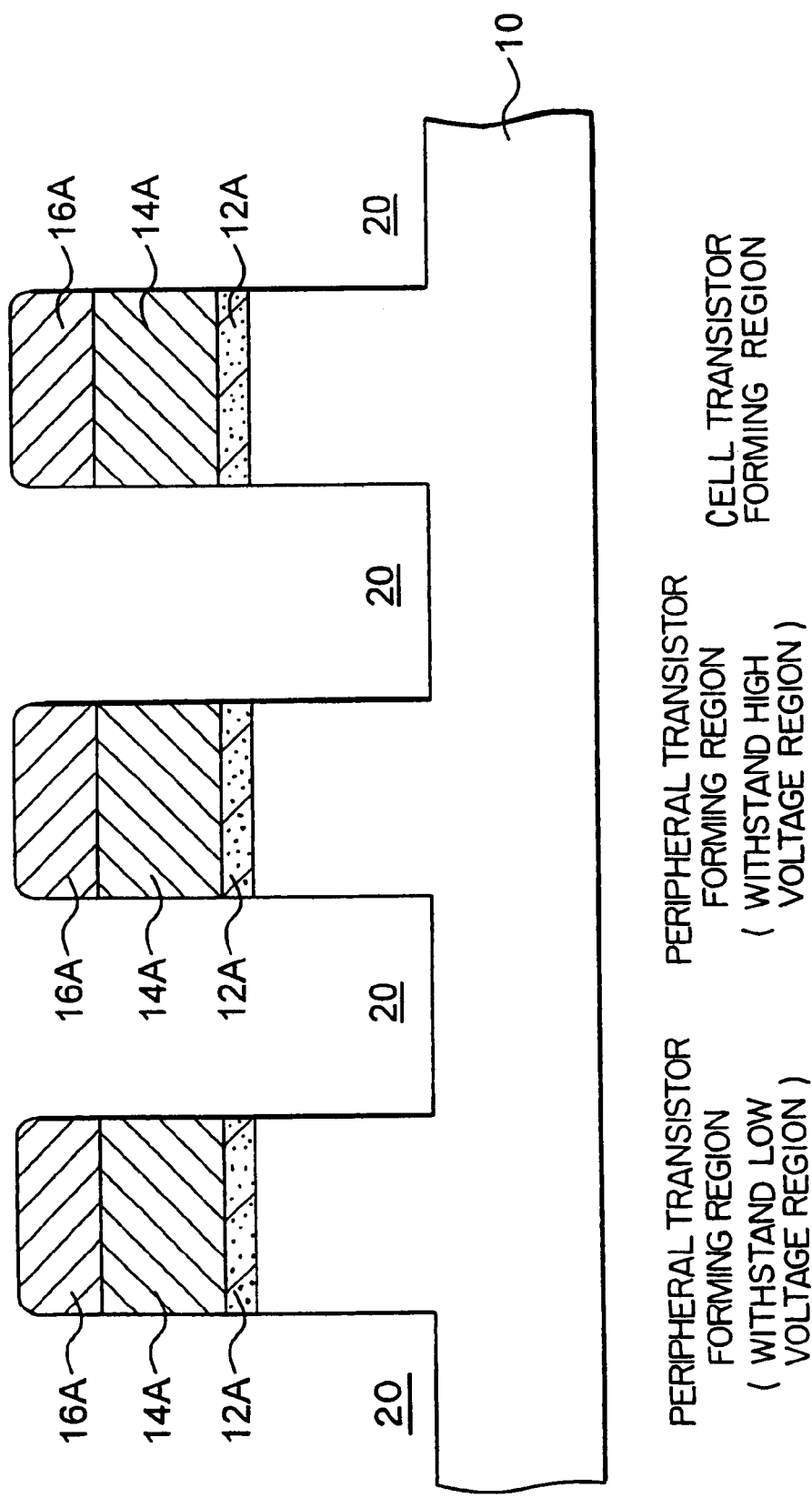
FIG. 2 is a cross-sectional partial view of the nonvolatile semiconductor storage device under the manufacturing process according to the first embodiment of the invention.

After that, as shown in FIG. 2, using the photoresist mask 18, the oxide film 16, nitride film 14 and pad oxide film 12 are sequentially etched and removed by RIE (reactive ion etching). The photo resist mask 18 is removed thereafter by a resist removal process. As a result, the pattern of the active region is copied from the photoresist mask 18 onto the oxide film 16, nitride film 14 and pad oxide film 12, and an oxide film 16A, nitride film 14A and pad oxide film 12A having openings in STI forming regions are formed.

After that, using the multi-layered film made up of these oxide film 16A, nitride film 14A and pad oxide film 12A as a hard pattern mask, the semiconductor substrate 10 is etched by RIE. As a result, trench isolation apertures (element separation regions) 20 are formed in the semiconductor substrate 10. Subsequently, HF processing (hydrofluoric processing), i.e. HF dip or HF vapor cleaning is conducted as an aftertreatment of RIE of the semiconductor substrate 10 to remove reaction products by RIE.

After that, as shown in FIG. 3, the width of the nitride film 14A is narrowed in both the peripheral transistor forming region and the cell transistor forming region to make the nitride film 14B. More specifically, the first processing by a HF glycerol mixture is conducted to selectively etch the nitride film 14A as the mask. This process is generally called pull-back process. By the pull-back process, the width of the nitride film 14A is narrowed by A1 in all patterns. That is, the pull-back amount of the nitride film 14A by the first processing with the HF glycerol mixture is A1.

Figure 4:
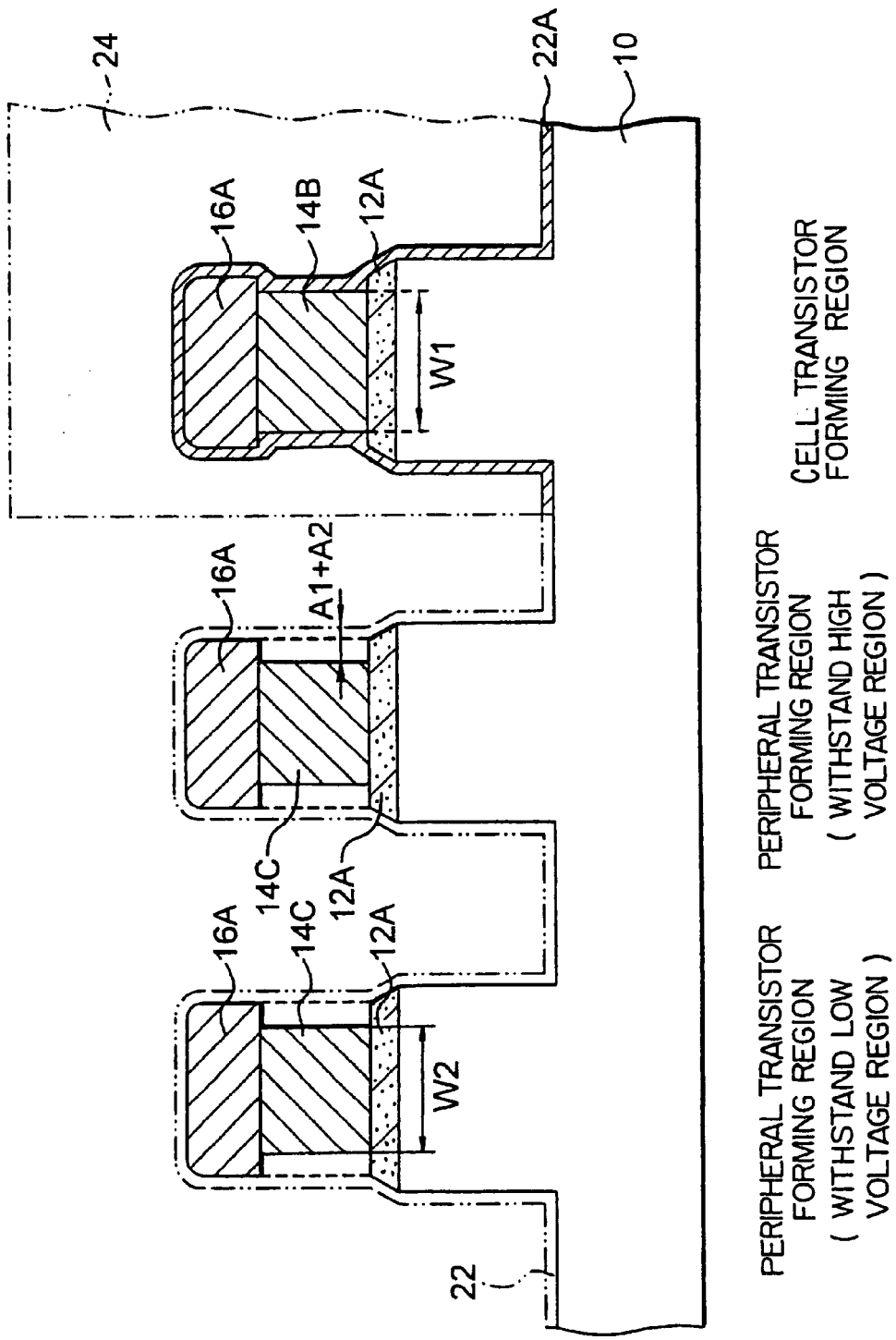
FIG. 4 is a cross-sectional partial view of the nonvolatile semiconductor storage device under the manufacturing process according to the first embodiment of the invention.

Next as shown in FIG. 4, an oxide film 22 is formed by CVD, for example. In this embodiment, the oxide film 22 is formed by CVD using TEOS or $SiH_4$, and has the thickness of 5 nm through 20 nm. This oxide film 22 is used as a mask upon etching the nitride film 14B by HF glycerol processing which will be conducted in the next second time, et seq.

After that, a photoresist mask 24 is formed in the cell transistor forming region by photolithography.

Subsequently, maintaining the photoresist mask 24, the oxide film 22 is removed from the peripheral transistor forming region. As a result, the oxide film 22A remains only in the cell transistor forming region.

The photoresist mask 24 is removed thereafter. And, by conducting the second processing by HF glycerol, the nitride film 14B is narrowed by A2 in the region from which the oxide film was removed (the peripheral transistor forming region) to form the nitride film 14C. That is, additional pull-back process is conducted for the nitride film 14B in the peripheral transistor forming region. As a result of the additional pull-back process, the nitride film 14B in the peripheral transistor forming region is further narrowed by A2, and the nitride film 14C is narrower than the original nitride film 14A by A1+A2 in total.

There are some reasons in not employing the method of directly masking the cell transistor forming region with the photoresist mask 24 in the second processing by HF glycerol. The first reason lies in that the photoresist mask is not resistant to glycerin used as the solvent of HF glycerol. The second is for preventing impurities from entering into the semiconductor substrate 10 from the photoresist by avoiding direct contact of the photoresist with the cell transistor forming regions. The third is for preventing bird's beaks from biting into the lower side of the nitride film 14B by a rounding oxide film which will be formed later (oxide film 26 in FIG. 5). If birds beaks enter under the nitride film 14B, they will cause fluctuation in channel width of cell transistors which are made later, and adversely affect the reliability of the tunnel oxide films. These can be prevented in this manner.

Figure 5:
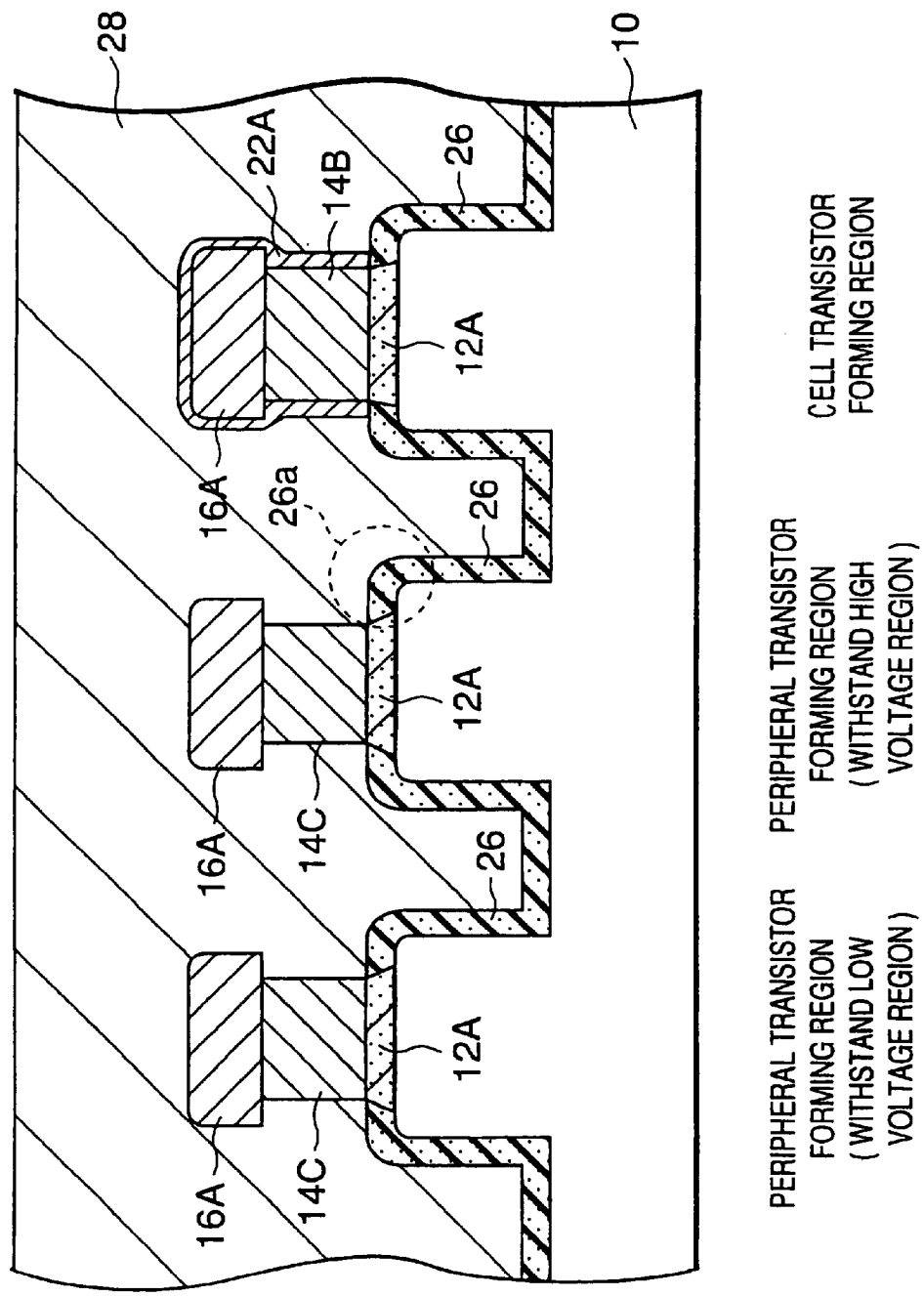
FIG. 5 is a cross-sectional partial view of the nonvolatile semiconductor storage device under the manufacturing process according to the first embodiment of the invention.

Next as shown in FIG. 5, the oxide film 26 is formed on the patterned semiconductor substrate 10 by thermal oxidation, for example. In this embodiment, the oxide film 26 is stacked up to the thickness of 5 nm through 40 nm. In this case, oxidation is conducted under conditions for rounding corners 26a which will finally become the active region.

After that, a buried oxide film 28 is staked on the semiconductor substrate 10 as the material for burying the element isolating region (STI forming regions). The buried oxide film 28 can be made by stacking a oxide film by CVD using a TEOS or by HDP (high density plasma) method using a $SiH_4$, for example, to a thickness burying the depth from the semiconductor substrate 10 to amply above the oxide film 22A as the mask.

Figure 6:
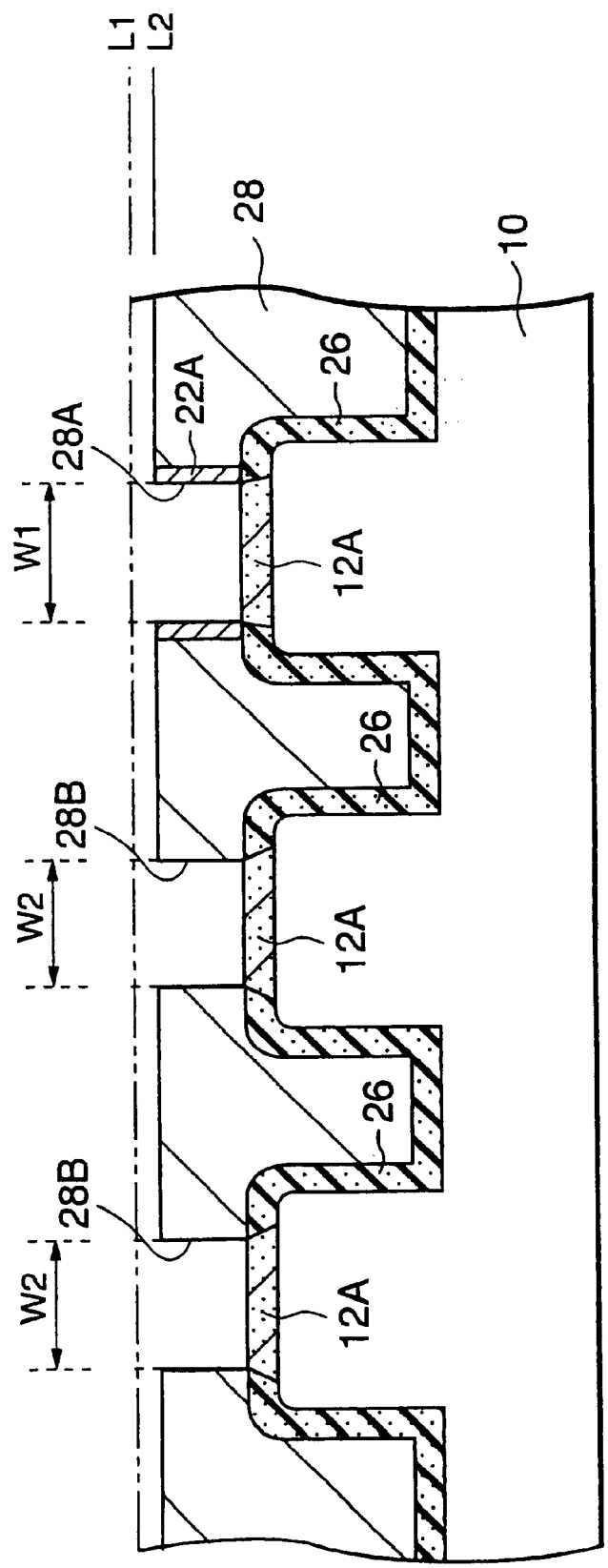
FIG. 6 is a cross-sectional partial view of the nonvolatile semiconductor storage device under the manufacturing process according to the first embodiment of the invention.

Next as shown in FIG. 6, the buried oxide film 28 is polished and smoothed by CMP (chemical mechanical polishing). At that time, the nitride films 14B and 14C used as hard pattern masks behave as polishing stoppers. By this CMP, the film 28 is polished down to the level of line L1. After that, wet etching by BHF, for example, is conducted, and small scratches and remains of polishing are removed from the surface of the buried oxide film 28 by lift-off.

After that, the nitride films 14B and 14C used as hard pattern masks are removed by wet etching using hot phosphoric acid, for example. By these two wet etching steps, the buried oxide film 28 is etched to the level of line L2. As a result, apertures 28A and 28B are formed in the buried oxide film 28. Width of the aperture 28A made here is W1, and width of the aperture 28B is W2 which is narrower than W1.

In this step, it is possible that pin holes, or the like, are produced in the pad oxide film 12A and cause the semiconductor substrate to be roughened by high-temperature annealing in a later step. Therefore, additional oxidation of about 10 nm is conducted by thermal oxidation. Thereafter, stress generated by burying STI is released by additional high-temperature annealing at 1000° C. or a higher temperature. That is, the stress generated by making STI and the buried oxide film 28 in the semiconductor substrate 10 is released.

Figure 7:
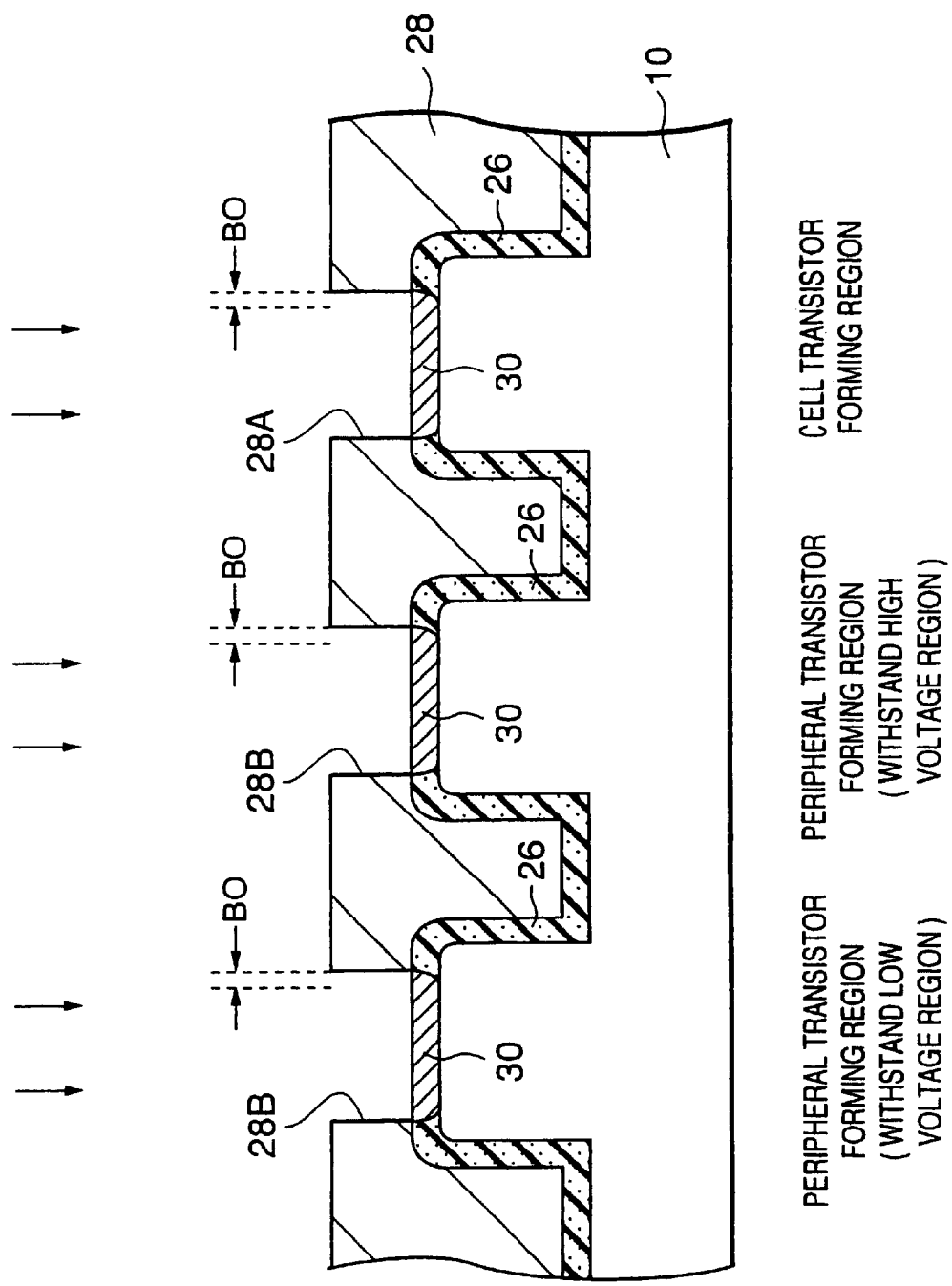
FIG. 7 is a cross-sectional partial view of the nonvolatile semiconductor storage device under the manufacturing process according to the first embodiment of the invention.

Next as shown in FIG. 7, the pad oxide films 12A located in apertures 28A and 28B are removed by wet etching. As a result of partial removal of the pad oxide film 12A, edges of STI in the active region retract by B0. In other words, apertures 28A and 28B are enlarged in width by B0. Subsequently, a sacrificial oxide film 30 is formed in the apertures 28A and 28B. The sacrificial oxide film 30 is used for ion implantation, and it is stacked up to the thickness of 10 nm through 30 nm in this embodiment.

After that, in order to adjust the impurity profile in the well forming region, cell transistor forming region and peripheral transistor forming region, patterning is conducted by using a photoresist, and a desired impurity is introduced into the semiconductor substrate 10 by ion implantation. Subsequently, annealing is conducted to activate the impurity introduced into the semiconductor substrate 10.

Figure 8:
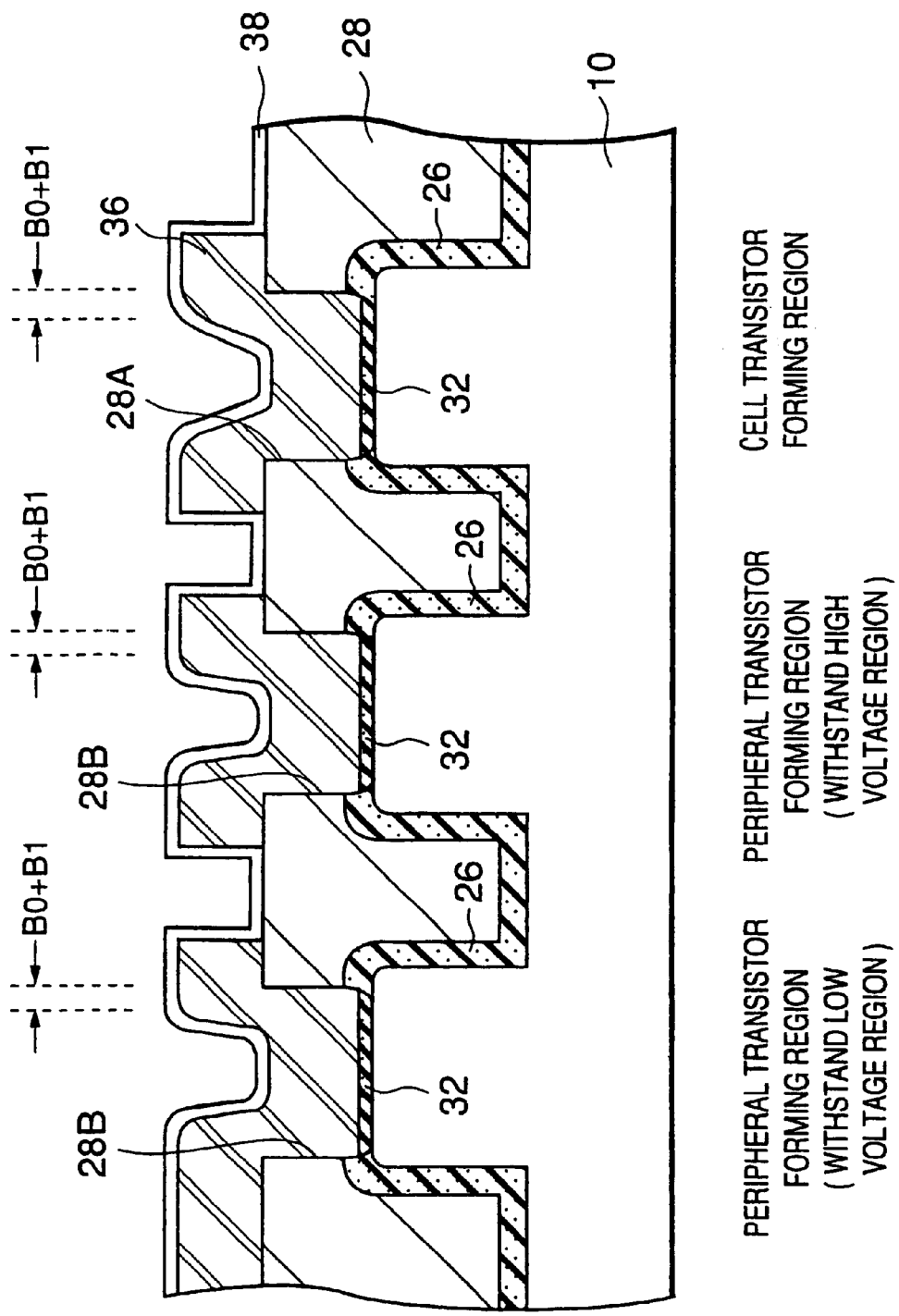
FIG. 8 is a cross-sectional partial view of the nonvolatile semiconductor storage device under the manufacturing process according to the first embodiment of the invention.

Next as shown in FIG. 8, for the purpose of forming a tunnel oxide film 32, wet etching is conducted to remove the sacrificial oxide film 30 from apertures 28A and 28B. As a result of this wet etching, STI edges further retract by B1 in the peripheral transistor forming region and the cell transistor forming region. That is, the apertures 28A and 28B are expanded in width by B0+B1 in total.

After that, by tunnel oxidation, a tunnel oxide film 32 of the cell transistor is formed in the apertures 28A and 28B. In this embodiment, the tunnel oxide film 32 is stacked up to the thickness of 8 nm through 10 nm. Subsequently, polysilicon doped with phosphorus to be used as a floating gate of the cell transistor is stacked, and slits 34 are made in the polysilicon. As a result, the floating gate 36 of the cell transistor is obtained. Subsequently, an ONO insulating film 38 is formed on the floating gate 36.

Figure 9:
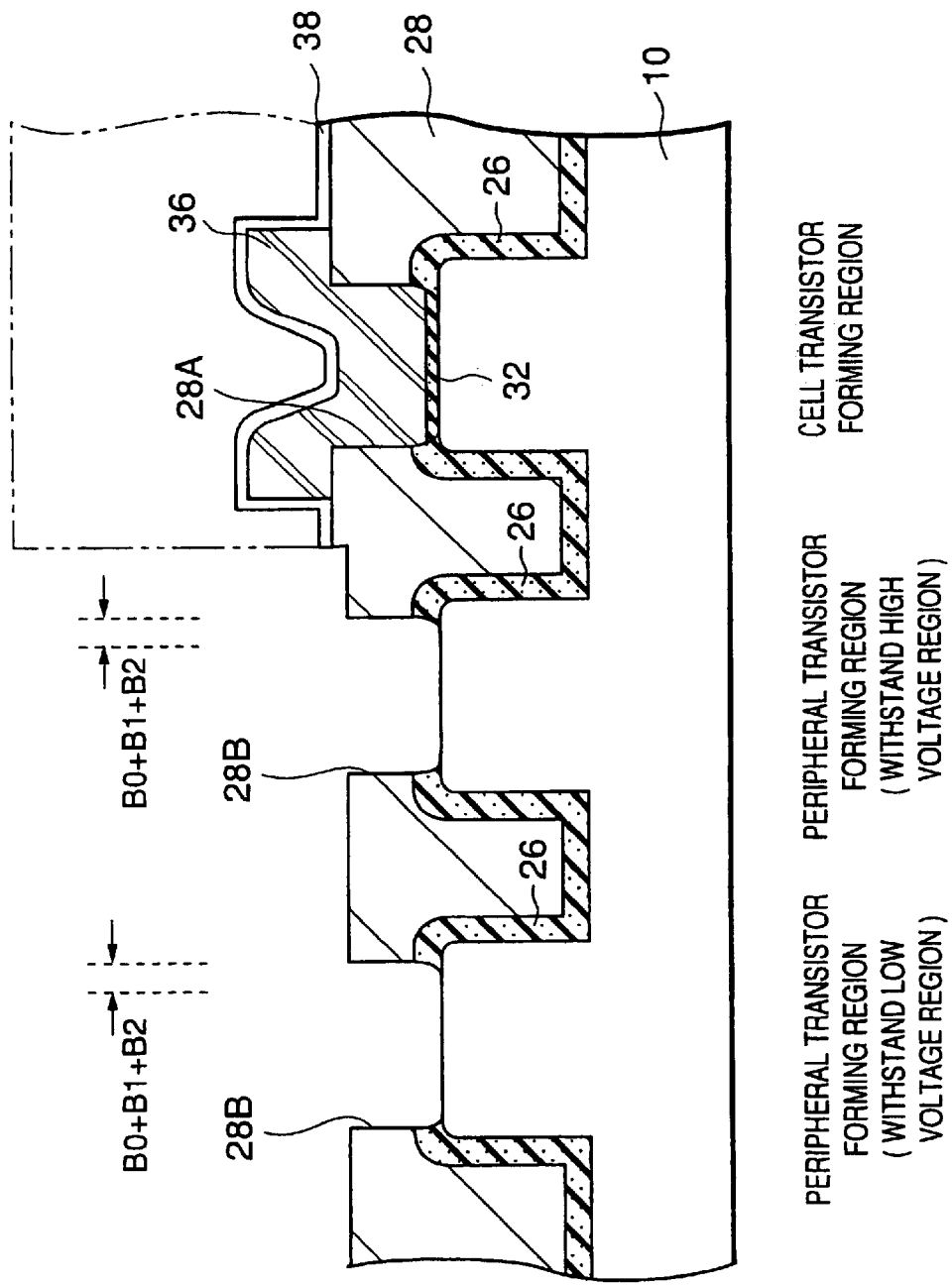
FIG. 9 is a cross-sectional partial view of the nonvolatile semiconductor storage device under the manufacturing process according to the first embodiment of the invention.

Next as shown in FIG. 9, a photoresist mask 40 is made by photolithography so as to cover the cell transistor forming region. Then, using the photoresist mask 40, the ONO insulating film 38 and the polysilicon forming the floating gate 36 are conducted patterning to remove them from the peripheral transistor forming region by dry etching.

Thereafter, the tunnel oxide film 32 is removed from the peripheral transistor forming region by wet etching. As a result of this wet etching, STI edges in the peripheral transistor forming region further retract by B2. In other words, width of each aperture 28B is expanded by B0+B1+B2 in total. The photoresist mask 40 is removed thereafter.

Figure 10:
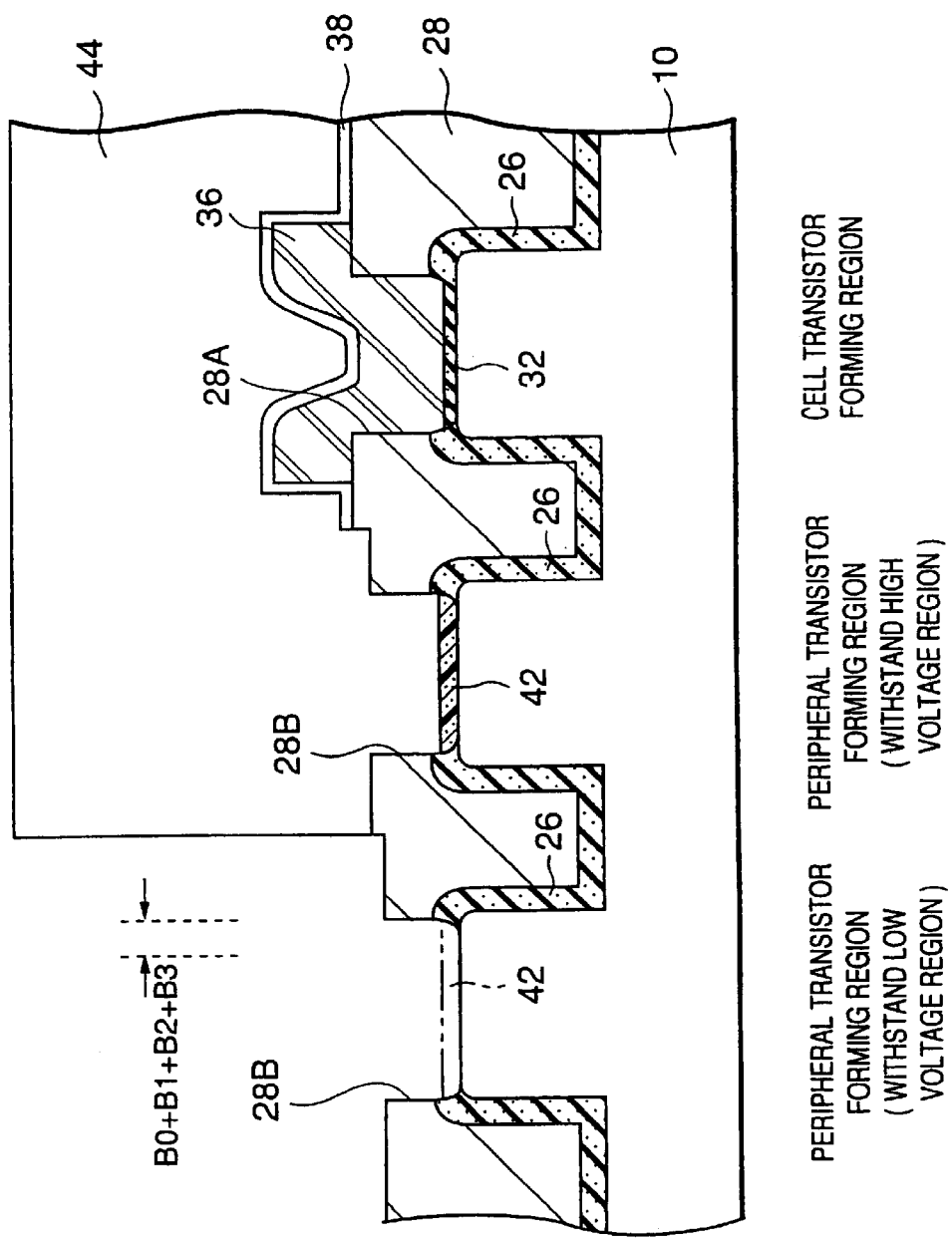
FIG. 10 is a cross-sectional partial view of the nonvolatile semiconductor storage device under the manufacturing process according to the first embodiment of the invention.

Next as shown in FIG. 10, a first peripheral gate oxide film 42 is formed in the apertures 28B in the peripheral transistor forming region. In this embodiment, the first peripheral gate oxide film 42 is stacked up to the thickness of 12 nm through 15 nm. In this process, since the floating gate 36 in the cell transistor forming region is protected by the ONO insulating film 38, it is never oxidized.

After that, a photoresist mask 44 having an aperture, which is located in a region in which a thin gate oxide film should be made (low voltage-withstanding region) within the peripheral transistor forming region, is formed. That is, the photoresist mask 44 is formed to cover the cell transistor forming region and the high voltage-withstanding region of the peripheral transistor forming region. Having this photoresist mask 44 thereon, wet etching is conducted. Thereby, the first peripheral gate oxide film 42 is removed from the region of the peripheral transistor forming region, in which a thin gate oxide film should be made. That is, the first peripheral gate oxide film 42 is removed from the aperture 28B in the low voltage-withstanding region. As a result, STI edges further retract by B3 in the low voltage-withstanding region. That is, width of the aperture 28B in the low voltage-withstanding region is enlarged by B0+B1+B2+B3 in total.

Figure 11:
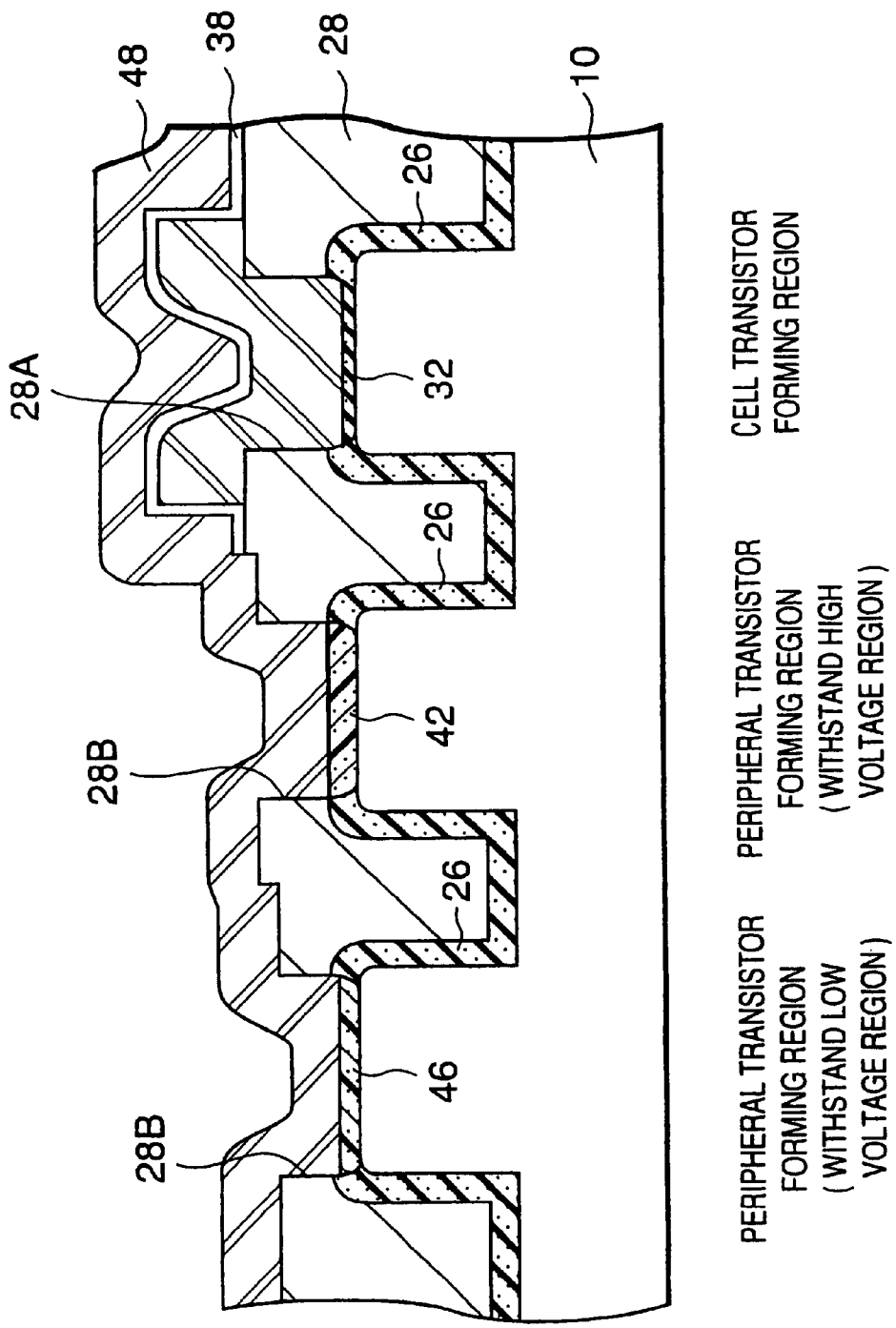
FIG. 11 is a cross-sectional partial view of the nonvolatile semiconductor storage device under the manufacturing process according to the first embodiment of the invention.
Figure 14:
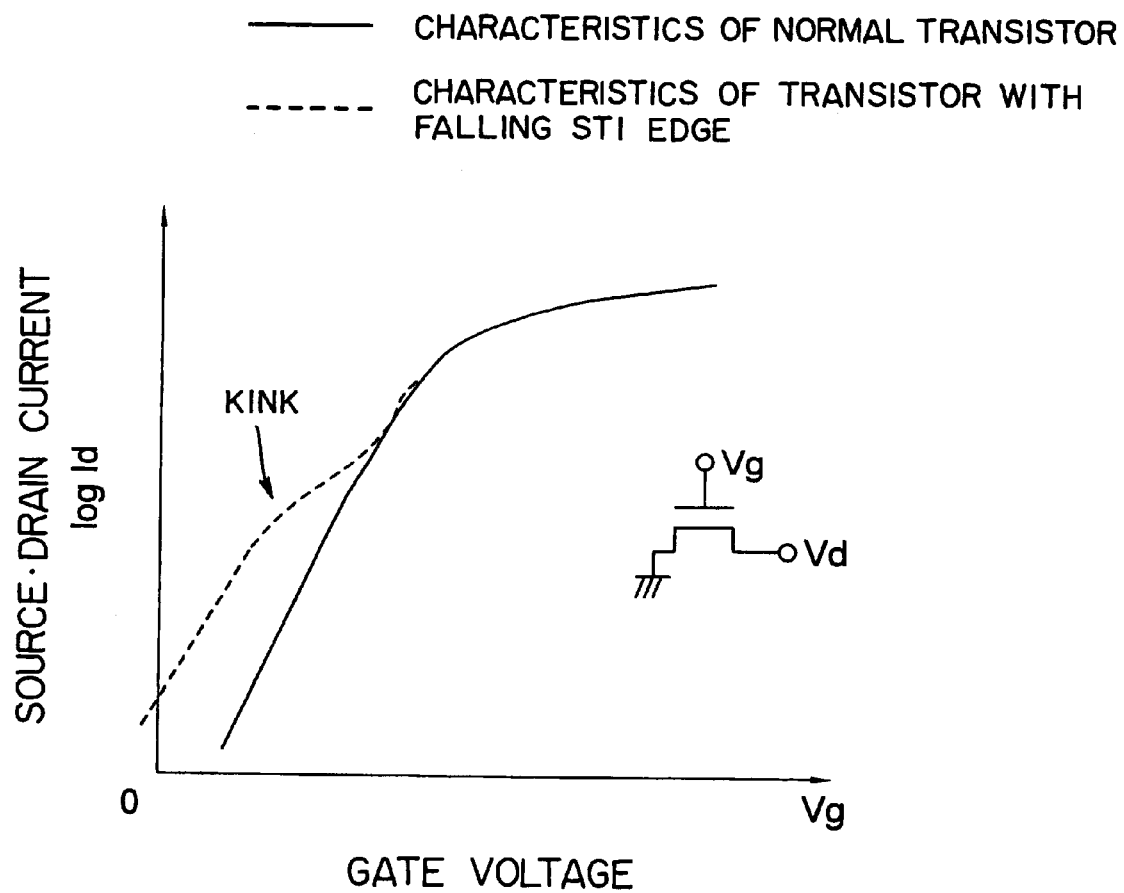
FIG. 14 is a graph showing Vg-Id characteristics of a transistor having a kick tendency.

The photo resist mask 44 is removed thereafter. After that, a second peripheral gate oxide film 46 is formed in the low voltage-withstanding region of the peripheral transistor forming region. In this embodiment, the second peripheral gate oxide film 46 is stacked up to the thickness of 4 nm through 6 nm. In this case, since the first peripheral gate oxide film 42 in the high voltage-withstanding region is additionally oxidized, its thickness increases. As shown in FIG. 11, next stacked is polysilicon 48 to be used as the control gate of the cell transistor and the gate of the peripheral transistor.

After that, although not shown, the polysilicon 48 is patterned to pattern the gate electrode of the cell transistor and the gate electrode of the peripheral transistor. Subsequently, ion implantation is conducted to form a diffusion layer necessary for making the cell transistor and the peripheral transistor, and after a side wall is formed, impurities are introduced into the high-concentrated diffusion layer and the gate polysilicon. In this case, As (arsenic) and/or Sb (antimony) is/are introduced into the NMOS region and B (boron) into the PMOS region. After that, a typical silicide process is conducted to form a wiring layer, followed by finally forming a passivation layer. Here is finished the manufacturing process of the nonvolatile semiconductor storage device.

As explained above, in the manufacturing method of a nonvolatile semiconductor storage device according to the invention, since the nitride films 14B and 14C used as masks are different in width as shown in FIG. 4, it is prevented that STI edges fall from the level of the active region. That is, since the width W2 of the nitride film 14C is narrower than the width W1 of the nitride film 14B, width of the aperture 28B formed in the buried oxide film can be made narrower than the width of the aperture 28A as shown in FIG. 6. Therefore, even when the width of the aperture 28B is expanded by etching for removal of the tunnel oxide film 32 of the aperture 28B after formation of the floating gate 36, it is prevented that the polysilicon 48 to be used as the gate falls into STI edges. It is therefore possible to prevent the conventional problem that kink characteristics appear in the cell transistor and the sub-threshold region of the peripheral transistor.

Further, as shown in FIG. 11, in case of forming three kinds of oxide films different in thickness, namely, tunnel oxide film 32, first peripheral gate oxide film 42 and second peripheral gate oxide film 46, falling of STI edges from the level of the active region can be prevented only by ensuring that relations among retracting amounts B0, B1, B2, B3 of the buried oxide film 28 at STI edges and the retracting amount of the nitride film 14 by pull-back satisfy B0+B1<A1 and B0+B1+B2+B3<A1+A2. The retracting amount of the aperture 28A in the buried oxide film 28 in the cell transistor forming region is B0+B1, the retracting amount of the aperture 28B in the buried oxide film 28 in the high voltage-withstanding region of the peripheral transistor region is B0+B1+B2, and the retracting amount of the aperture 28B in the buried oxide film 28 in the low voltage-withstanding region of the peripheral transistor forming region is B0+B1+B2+B3. In this manner, polysilicon 48 to be used as the gate can be prevented from falling into STI edges in the low voltage-withstanding region and the high voltage-withstanding region of the peripheral transistor forming region and in the cell transistor forming region.

From this relation, it is known that required retracting amounts of the nitride film 14 by pull-back are A1>B0+B1 and A2>B2+B3.

Moreover, as shown in FIG. 4, since the pull-back amount of the nitride film 14B can be minimized, fluctuation in channel width in the cell transistor can be prevented. That is, since the pull-back process is wet processing, fluctuation in etching amount is liable to occur; however, since this embodiment requires the pull-back process only once for the nitride film 14B in the cell transistor forming region, and can simultaneously minimize the etching amount, fluctuation in STI width in the cell transistor forming region is reduced, and fluctuation in channel width in the cell transistor can be prevented.

Additionally, as shown in FIG. 8, unevenness of the semiconductor substrate 10 during formation of the tunnel oxide film 32 can be prevented. In greater detail, when the sacrificial oxide film 30 is removed by wet etching after the pad oxide film 12A is removed, a difference in level is produced because the sacrificially oxidized portion descends. The portion where the level difference occurs results in shifting into the active region as the pull-back amount increases. If the pull-back amount is small, the portion comes closer to the rounded end portion of the active region, and such a structure is less liable to produce the level difference. Therefore, by making the pull-back amount of the cell transistor forming region smaller than the pull-back amount of the peripheral transistor forming region like this embodiment, unevenness of the substrate surface can be prevented. Especially in a cell transistor such as flash memory configured to apply a high electric field to the tunnel oxide film for program and erase operations, if a level difference is produced on the substrate surface, concentration of the electric field, or the like, occurs at the portion with the level difference, and it adversely affects the property of the cell transistor. This embodiment, however, can prevent this problem.

Furthermore, as shown in FIG. 4, since the cell transistor forming region is covered by the oxide film 22A upon the pull-back processing of the nitride film 14B in the peripheral transistor forming region, it is prevented that bird's beaks enter under the nitride film 14B as the channel portion of the cell transistor, and fluctuation in property of the cell transistor can be alleviated.

<Second Embodiment>

The second embodiment uses a multi-layered oxide film formed between the active region of the peripheral transistor forming region and polysilicon to have bird's beaks enter between the active region and the polysilicon so that, when the multi-layered oxide film is removed by etching to make a thick gate oxide film or the gate oxide film is removed by etching to make a thin gate oxide film, the active region does not fall so much even when STI edges retract. Taking a nonvolatile semiconductor storage device as an example, the second embodiment of the invention is explained below.

FIGS. 15 through 32 are cross-sectional views of the nonvolatile semiconductor storage device under different steps of a manufacturing process according to the embodiment. It will be understood from these figures that the embodiment employs a self-aligned STI process as the method for making the element isolation region.

Figure 15:
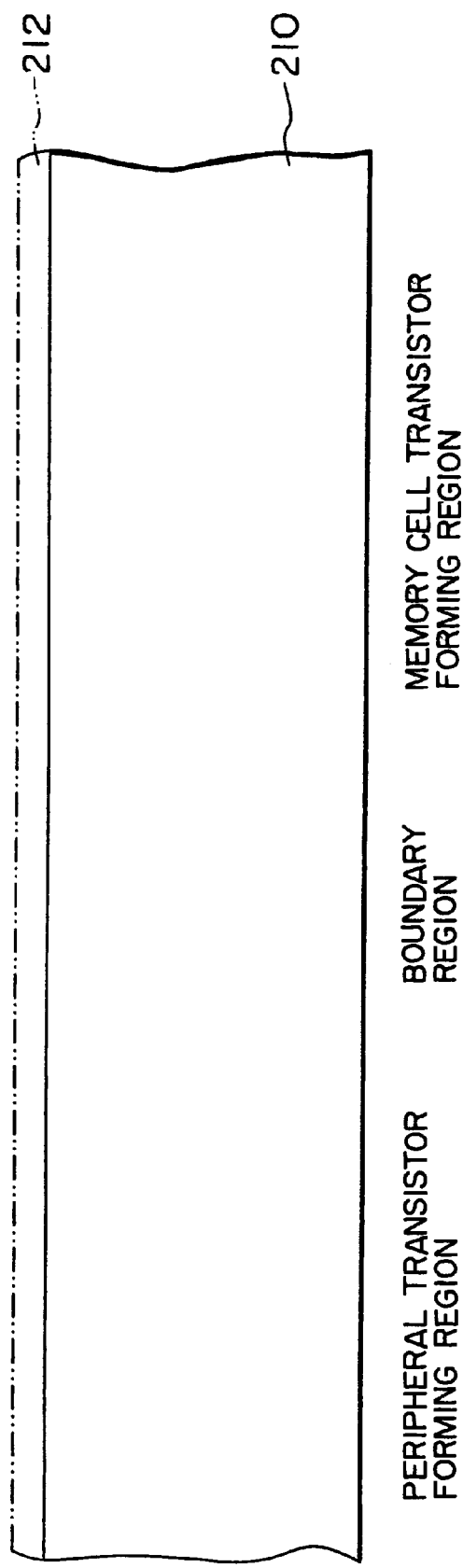
FIG. 15 is a cross-sectional partial view of a nonvolatile semiconductor storage device under a manufacturing process according to the second embodiment of the invention.

First as shown in FIG. 15, a pad oxide film 212 is formed on one surface of a semiconductor substrate 210 up to the thickness of 5 nm through 25 nm, for example, by thermal oxidation, etc. In this embodiment, the semiconductor substrate 210 is a silicon substrate. Subsequently, a mark for agreement of masks is patterned on the pad oxide film 212.

After that, for the purpose of adjusting the impurity profile of the well forming region, memory cell transistor forming region, peripheral transistor forming region, etc., the pad oxide film 212 is patterned by using a photoresist. Then, a desired impurity is injected into the surface side of the semiconductor substrate 210 by ion implantation.

Figure 16:
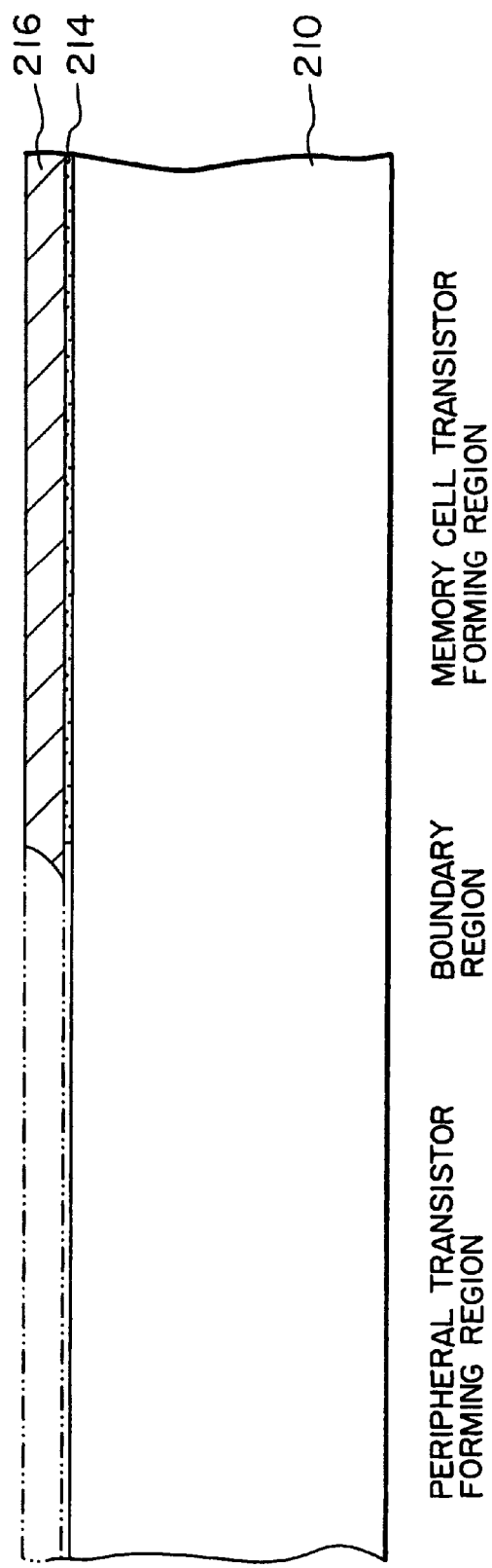
FIG. 16 is a cross-sectional partial view of the nonvolatile semiconductor storage device under the manufacturing process according to the second embodiment of the invention.

Next as shown in FIG. 16, the pad oxide film 212 is removed. Subsequently, a first oxide film 214 is formed on the semiconductor substrate 210 up to the thickness of 5 nm through 10 nm, for example. The first oxide film 214 finally forms the tunnel oxide film of the memory cell transistor. After that, first polysilicon 216 is stacked on the first oxide film 214. The first polysilicon 216 is a film which finally constitutes a part of the floating gate FG of the memory cell transistor. Thereafter, the first oxide film 214 and the first polysilicon 216 are removed from the peripheral transistor forming region by patterning with a photoresist.

Figure 17:
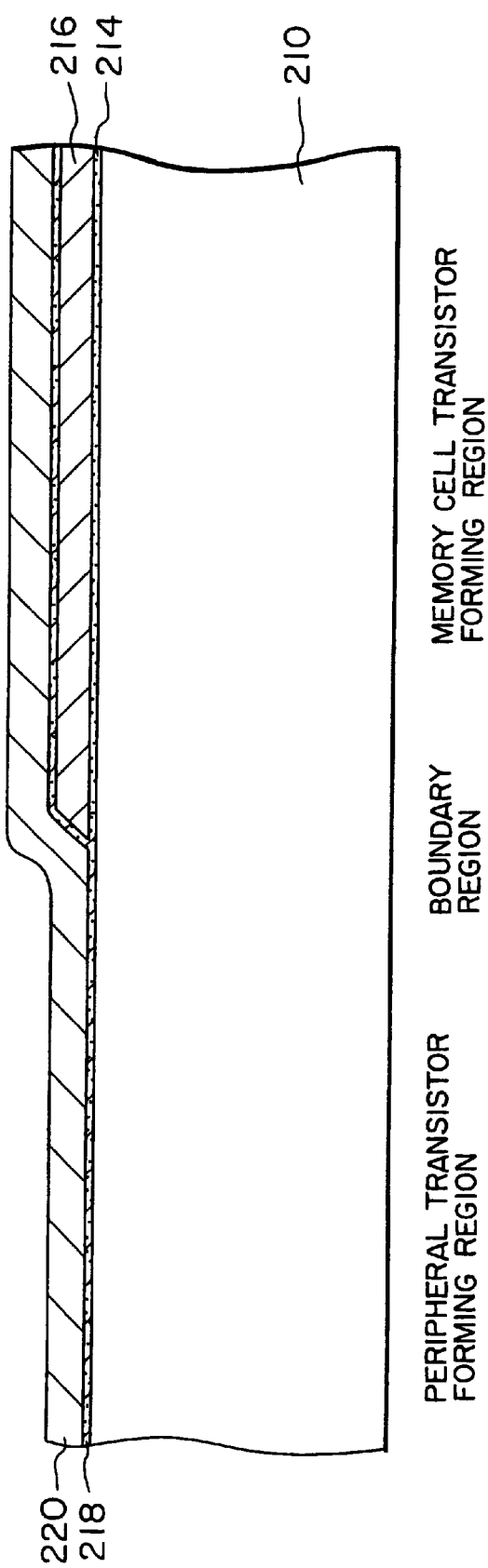
FIG. 17 is a cross-sectional partial view of the nonvolatile semiconductor storage device under the manufacturing process according to the second embodiment of the invention.

Next as shown in FIG. 17, a multi-layered oxide film 218 made up of a thermal oxide film and a TEOS oxide film is formed up to the thickness of 10 nm through 30 nm, for example, on the peripheral transistor forming region and the first polysilicon 216 in the memory cell transistor forming region. By adjusting the ratio in thickness between the thermal oxide film and the TEOS oxide film of the multi-layered oxide film 218, the mode of entry of bird's beaks during rounding oxidation explained later can be controlled. In this embodiment, the thermal oxide film is formed by thermal oxidation. After that, the TEOS oxide film is formed by CVD (chemical vapor deposition) using $Si(OC_2H_5)_4$. The multi-layered oxide film 218 is stacked thicker than the first oxide film 214. Thereafter, second polysilicon 220 is stacked on the multi-layered oxide film 218.

Figure 18:
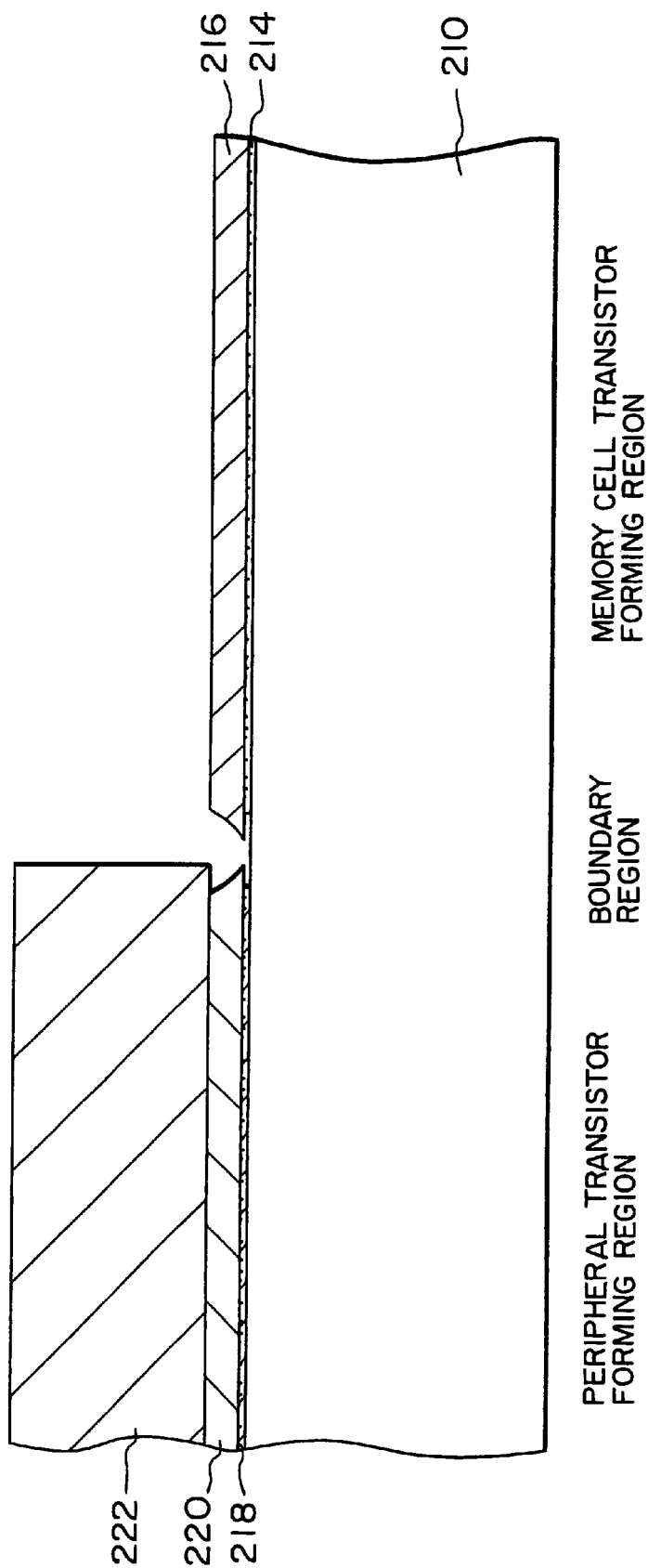
FIG. 18 is a cross-sectional partial view of the nonvolatile semiconductor storage device under the manufacturing process according to the second embodiment of the invention.

Next as shown in FIG. 18, a photoresist 222 is coated and patterned to cover the second polysilicon 220 in the peripheral transistor forming region. Then, using this photoresist 222 as a mask, the multi-layered oxide film 218 and the second polysilicon 220 are removed from the memory cell transistor forming region by dry etching.

Figure 19:
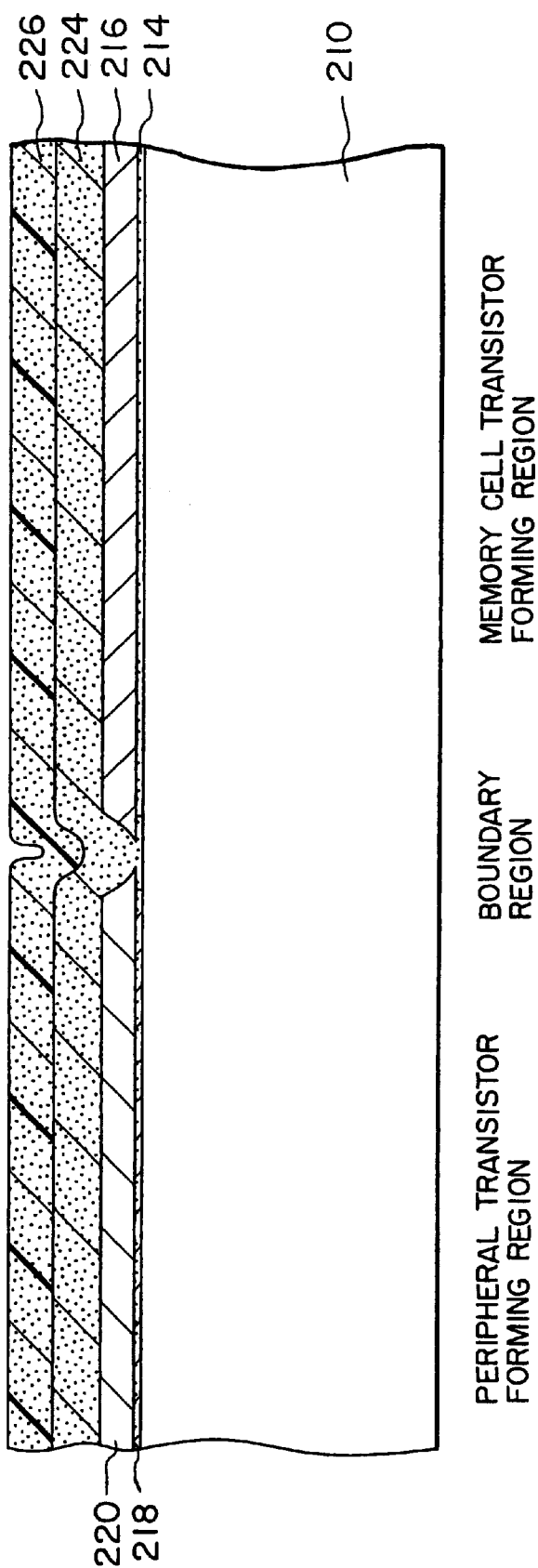
FIG. 19 is a cross-sectional partial view of the nonvolatile semiconductor storage device under the manufacturing process according to the second embodiment of the invention.

The photoresist 222 is removed thereafter as shown in FIG. 19. After that, a first nitride film 224 is formed all over the semiconductor substrate 210 including the first polysilicon 216 and the second polysilicon 220. In this time, before the first nitride 224 is formed, an oxide film may be formed selectively up to the thickness of 5 nm through 10 nm on the semiconductor substrate 210 in the boundary region by oxidation. In this embodiment, the first nitride film 224 is stacked by CVD up to the thickness of 100 nm through 200 nm. Thereafter, a second oxide film 226 is formed on the first nitride film 224 by CVD using TEOS or $SiH_4$. In this embodiment, the second oxide film 226 is stacked by CVD up to the thickness of the 100 nm through 200 nm.

Figure 20:
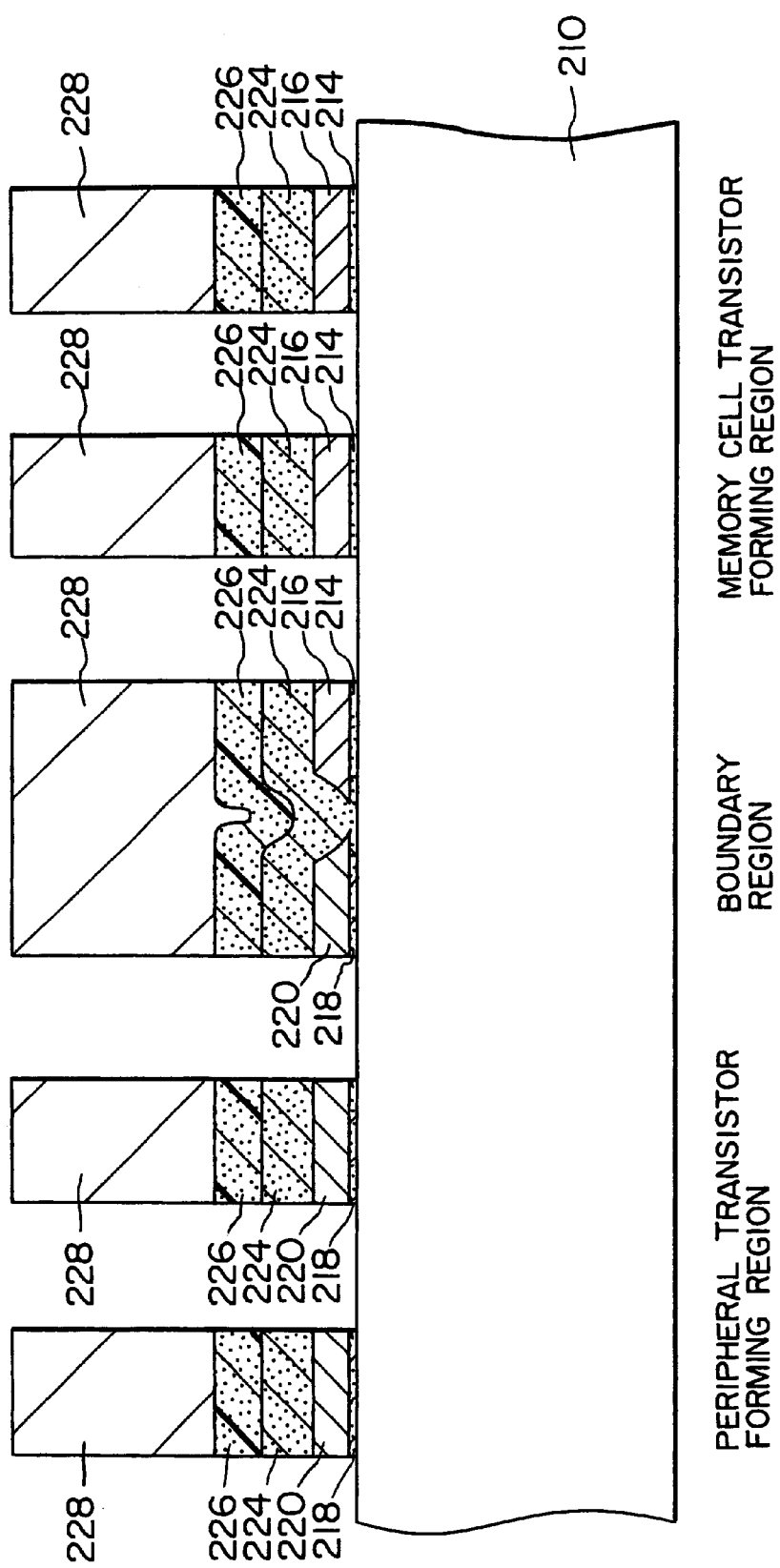
FIG. 20 is a cross-sectional partial view of the nonvolatile semiconductor storage device under the manufacturing process according to the second embodiment of the invention.

Next as shown in FIG. 20, a photoresist 228 is formed by photolithography for the purpose of patterning the active region. Using this photoresist 228 as a mask, the second oxide film 226, first nitride film 224, first polysilicon 216, second polysilicon 220, pad oxide film 214 and multi-layered oxide film 218 are etched sequentially by RIE (reactive ion etching). As a result, the pattern of the active region is copied from the photoresist 228 to the stack of second oxide film 226, first nitride film 224, first polysilicon 216 or second polysilicon 220, and pad oxide film 214 or multi-layered oxide film 218.

Figure 21:
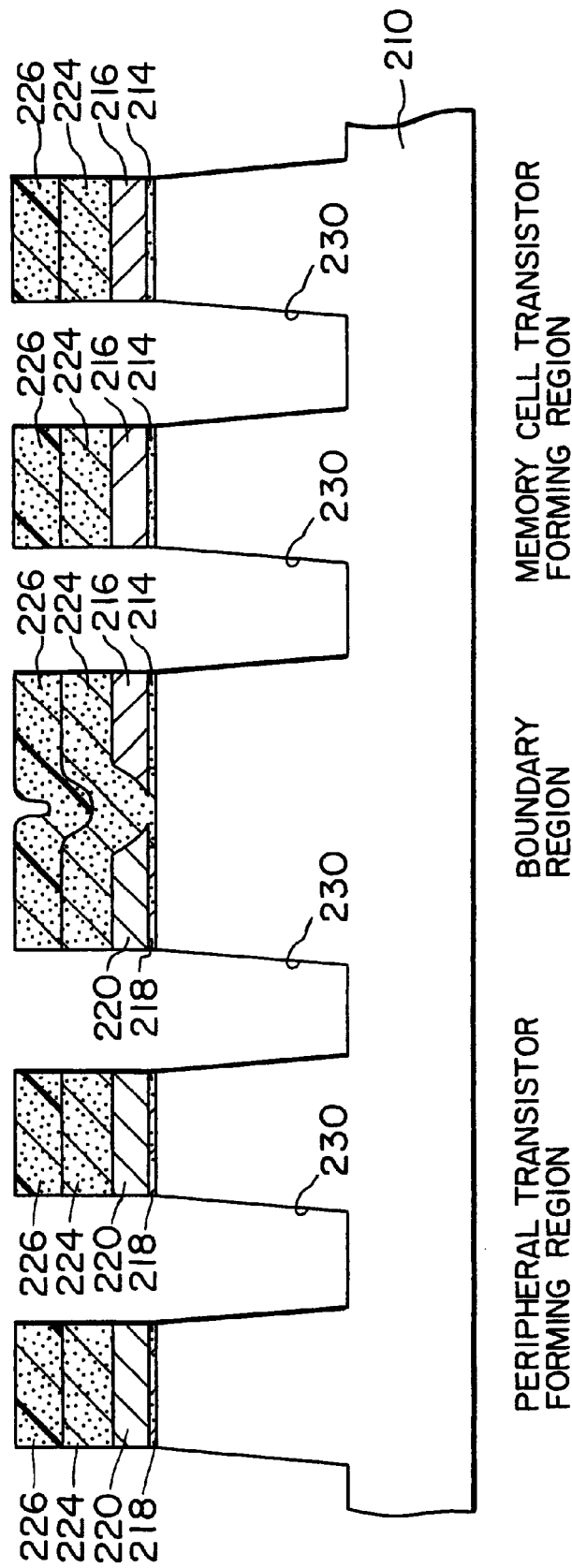
FIG. 21 is a cross-sectional partial view of the nonvolatile semiconductor storage device under the manufacturing process according to the second embodiment of the invention.

Next as shown in FIG. 21, the photoresist 228 is removed by a conventional resist removal process. After that, using the multi-layered film made up of the second oxide film 226 and other films as a hard mask, the semiconductor substrate 210 is etched by RIE to pattern apertures 230 for making trench isolation regions (element isolating regions). In this etching process, the boundary region between the memory cell transistor forming region and the peripheral transistor forming region is located in alignment with the active region.

Figure 22:
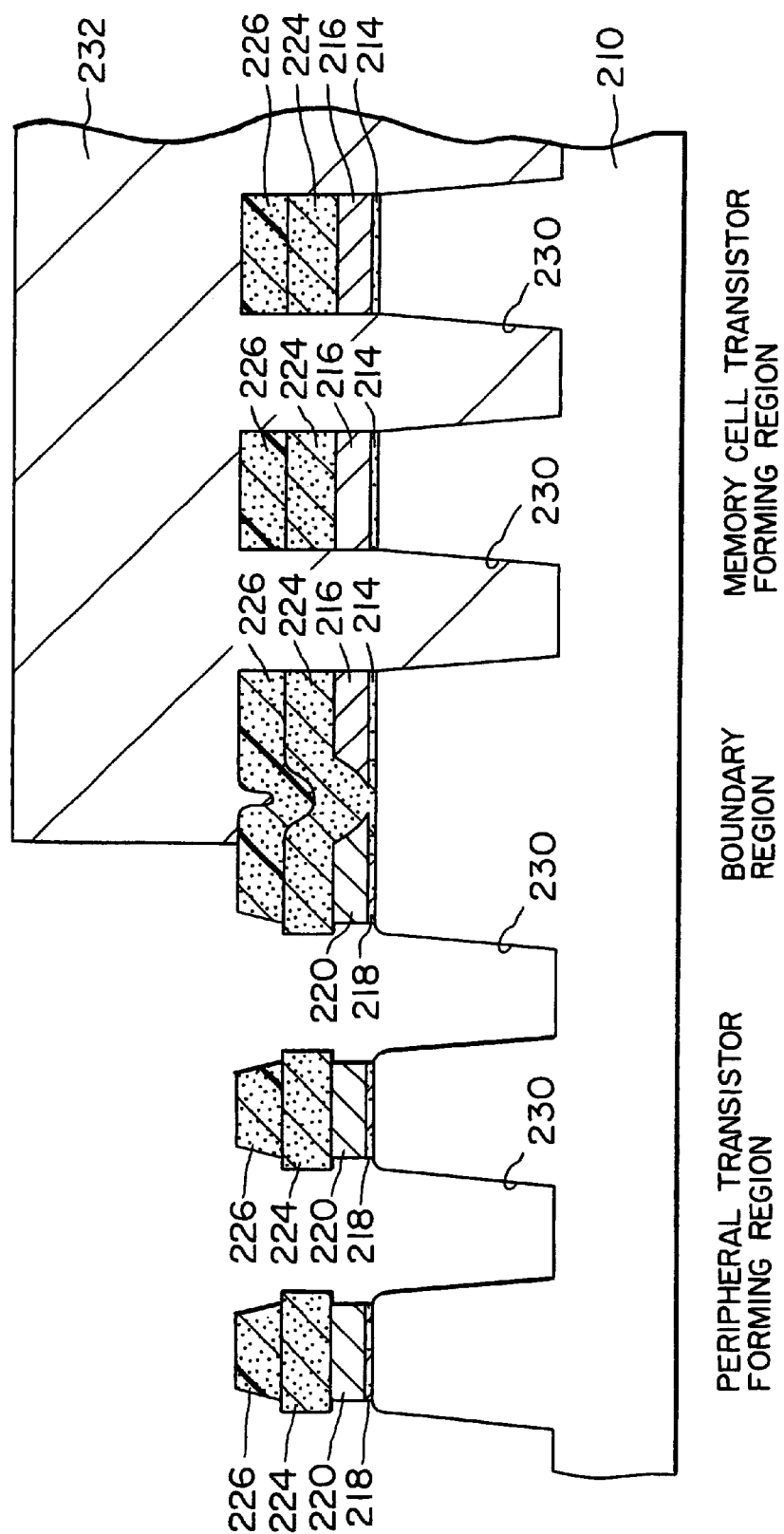
FIG. 22 is a cross-sectional partial view of the nonvolatile semiconductor storage device under the manufacturing process according to the second embodiment of the invention.

Next as shown in FIG. 22, a photoresist 232 is coated and patterned to cover the memory cell transistor forming region and expose the peripheral transistor forming region. Then, etching is conducted to round corner portions of the peripheral transistor forming region. As a result, corner portions of the second oxide film 226 in the peripheral transistor forming region are rounded, the second polysilicon 220 and the multi-layered oxide film 218 retract, and corner portions of the semiconductor substrate 210 are rounded.

Figure 23:
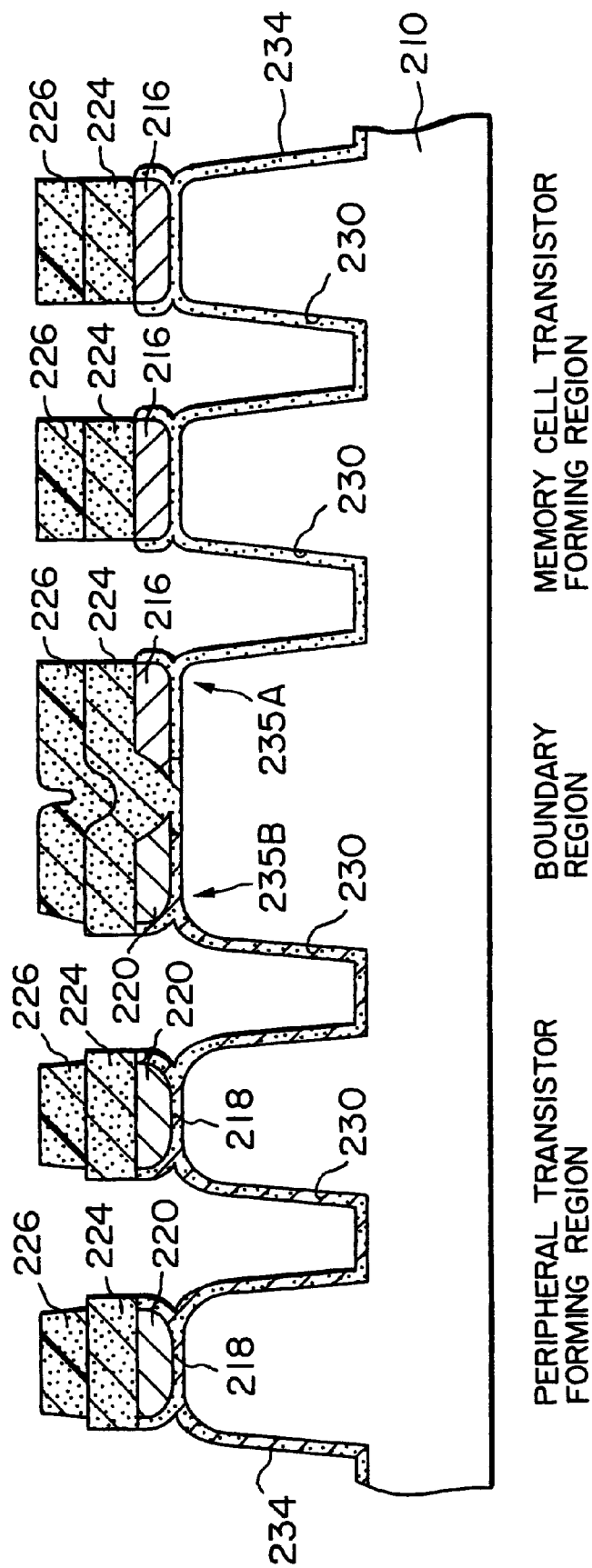
FIG. 23 is a cross-sectional partial view of the nonvolatile semiconductor storage device under the manufacturing process according to the second embodiment of the invention.

The photoresist 232 is removed thereafter as shown in FIG. 23. Subsequently, a third oxide film 234 is formed up to the thickness of 5 nm through 40 nm on the patterned semiconductor substrate 210 by thermal oxidation, for example. In this oxidation, oxidation conditions are adjusted to ensure that corner portions of the semiconductor substrate 210 to be used as the active region be rounded. As to the mode of bird's beaks above the active region of the semiconductor substrate 210 upon the oxidation, the biting depth at the corner portions 235B in the peripheral transistor forming region is longer than that at the corner portions 235A in the memory cell transistor forming region. The second polysilicon 220 is rounded more largely than the first polysilicon 216. Furthermore, the biting depth of the bird's beak can become longer by raising the ratio of the TEOS oxide film to the thermal oxide film in the multi-layered oxide film 218. That is, the multi-layered oxide film 218 is made up of the thermal oxide film and the TEOS oxide film as explained above, and by making the TEOS oxide film thicker, the biting depth of the bird's beaks can be increased. For example, the thickness of the thermal oxide film is in the range from 1 nm to 10 nm while the thickness of the TEOS oxide film is in the range from 5 nm to 50 nm. More preferably, the thickness of the thermal oxide film is 5 nm while the thickness of the TEOS oxide film is 20 nm.

Figure 24:
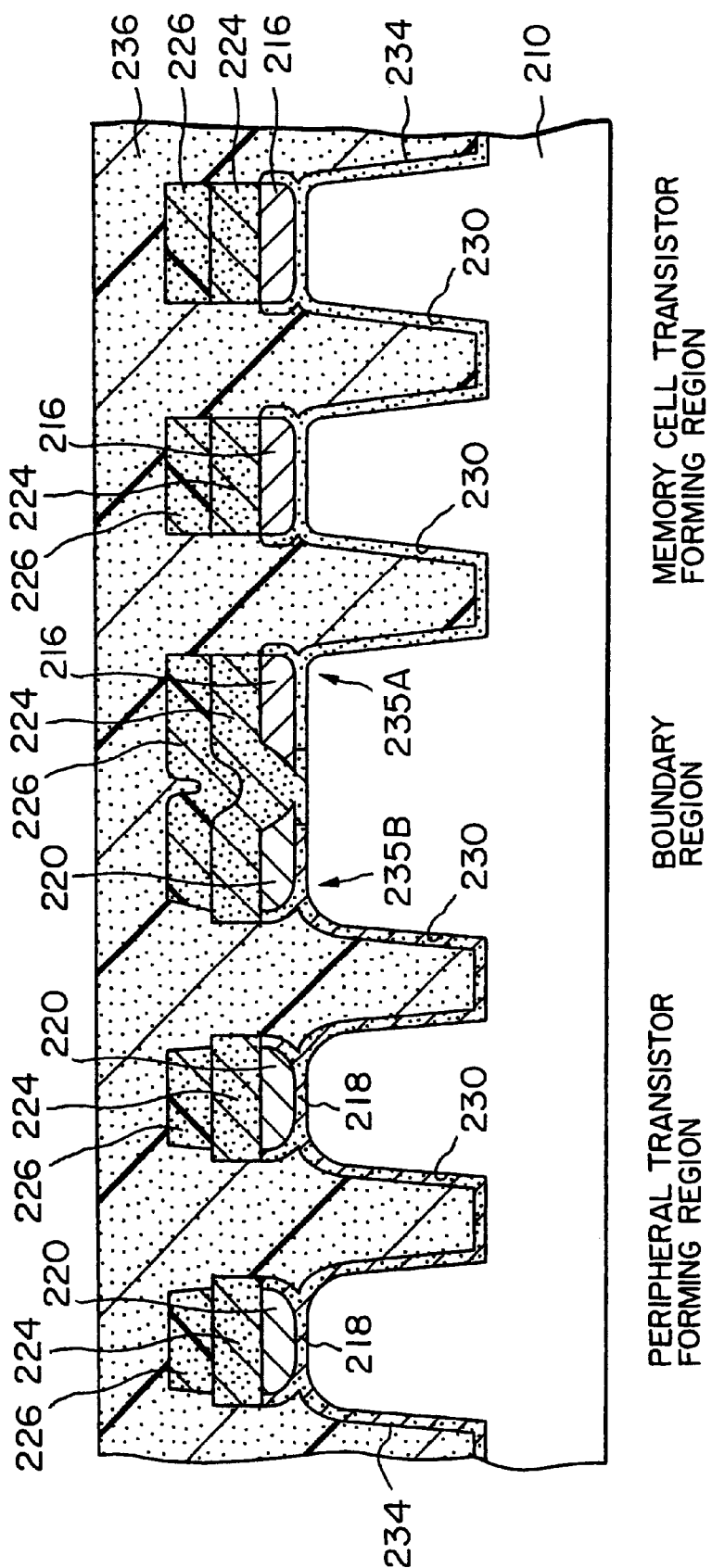
FIG. 24 is a cross-sectional partial view of the nonvolatile semiconductor storage device under the manufacturing process according to the second embodiment of the invention.

Next as shown in FIG. 24, a buried oxide film 236 as a buried material of the trench isolation forming regions is stacked to bury them. Usable as the stacking method of the buried oxide film 236 are, for example, stacking of an oxide film of TEOS by CVD using TEOS and stacking of an oxide film of $SiH_4$ by HDP (high density plasma) using $SiH_4$. By conducting any of these stacking methods under the conditions for amply bury the regions from the level of the semiconductor substrate 10 to the level of the second oxide film 226 as the mask material, the buried oxide film 236 is formed.

Figure 25:
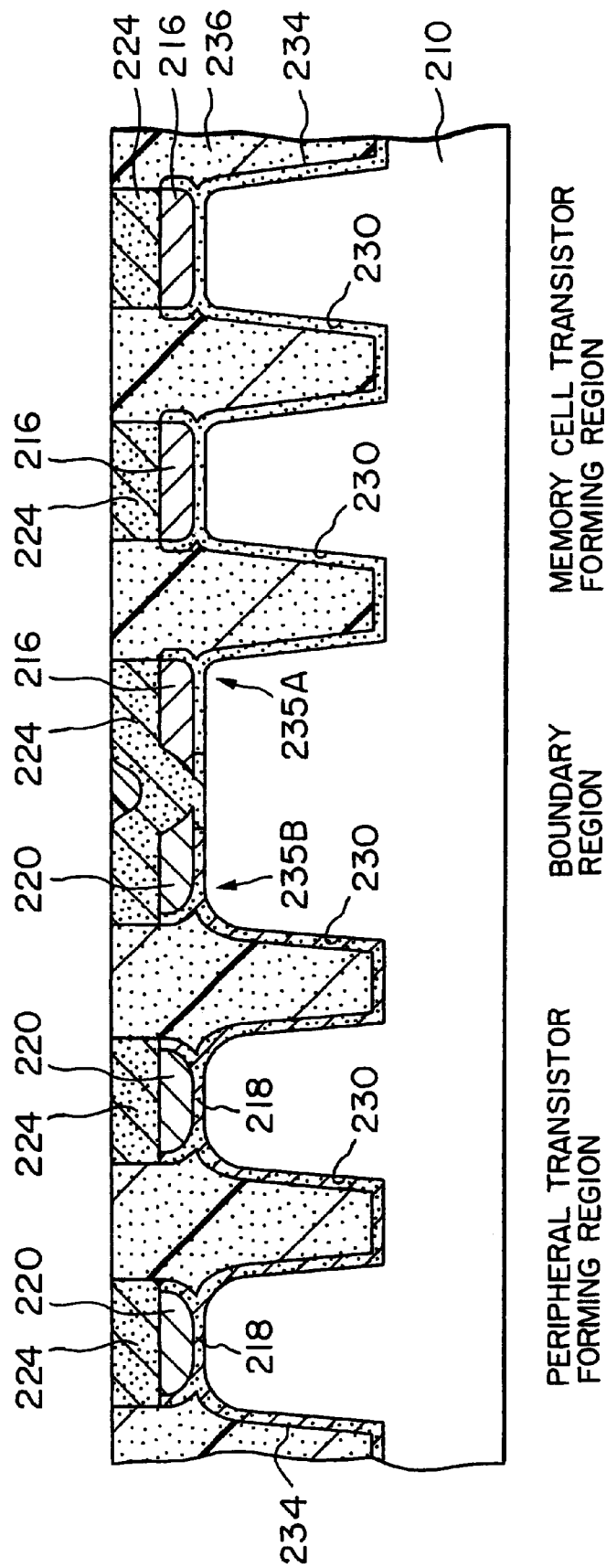
FIG. 25 is a cross-sectional partial view of the nonvolatile semiconductor storage device under the manufacturing process according to the second embodiment of the invention.

Next as shown in FIG. 25, the buried oxide film 236 is polished by CMP (chemical mechanical polishing) to smooth the surface of the semiconductor substrate 210. In this process, the first nitride film 224 used as the hard mask serves as a polishing stopper. After that, by high-temperature annealing at a temperature not lower than 900° C., stress generated by STI burying is released. Thereafter, wet processing with BHF or other appropriate agent, small scratches and remains of polishing are removed from the surface of the buried oxide film 236 by lift-off.

Figure 26:
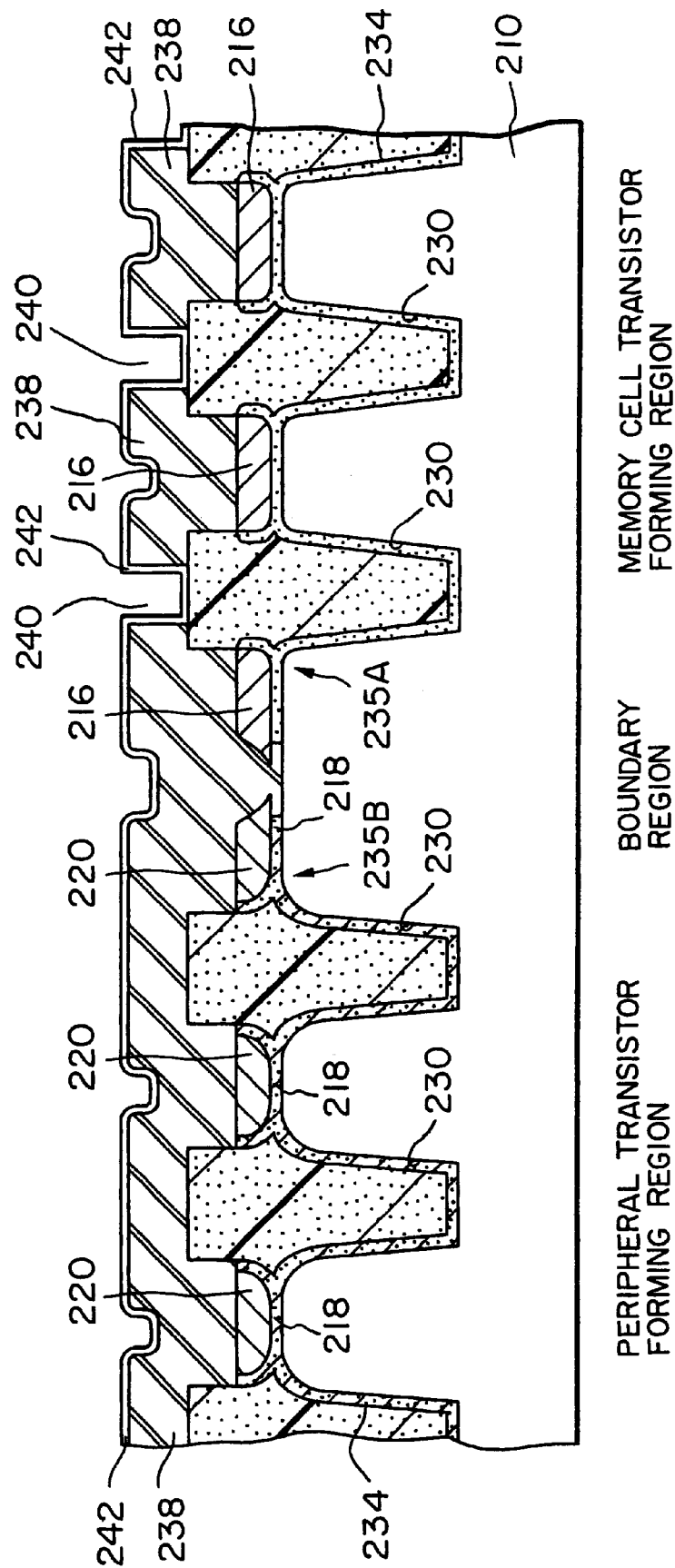
FIG. 26 is a cross-sectional partial view of the nonvolatile semiconductor storage device under the manufacturing process according to the second embodiment of the invention.

Next as shown in FIG. 26, the first nitride film 224 used as the mask material is removed by wet etching with hot phosphoric acid, for example. Then, a third polysilicon 238 doped with phosphorus is stacked. The third polysilicon 238 is a film finally constituting a part of the floating gate FG of the memory cell transistor. After that, for the purpose of making the floating gate FG of the memory cell transistor, a cell slit 240 is formed in the third polysilicon 238 to continuously extending in the bit line direction. Subsequently, an ONO (oxide-nitride-oxide) insulating film 242 is formed for use as a inter-gate insulating film between the floating gate FG and the control gate CG (see FIG. 32).

Figure 27:
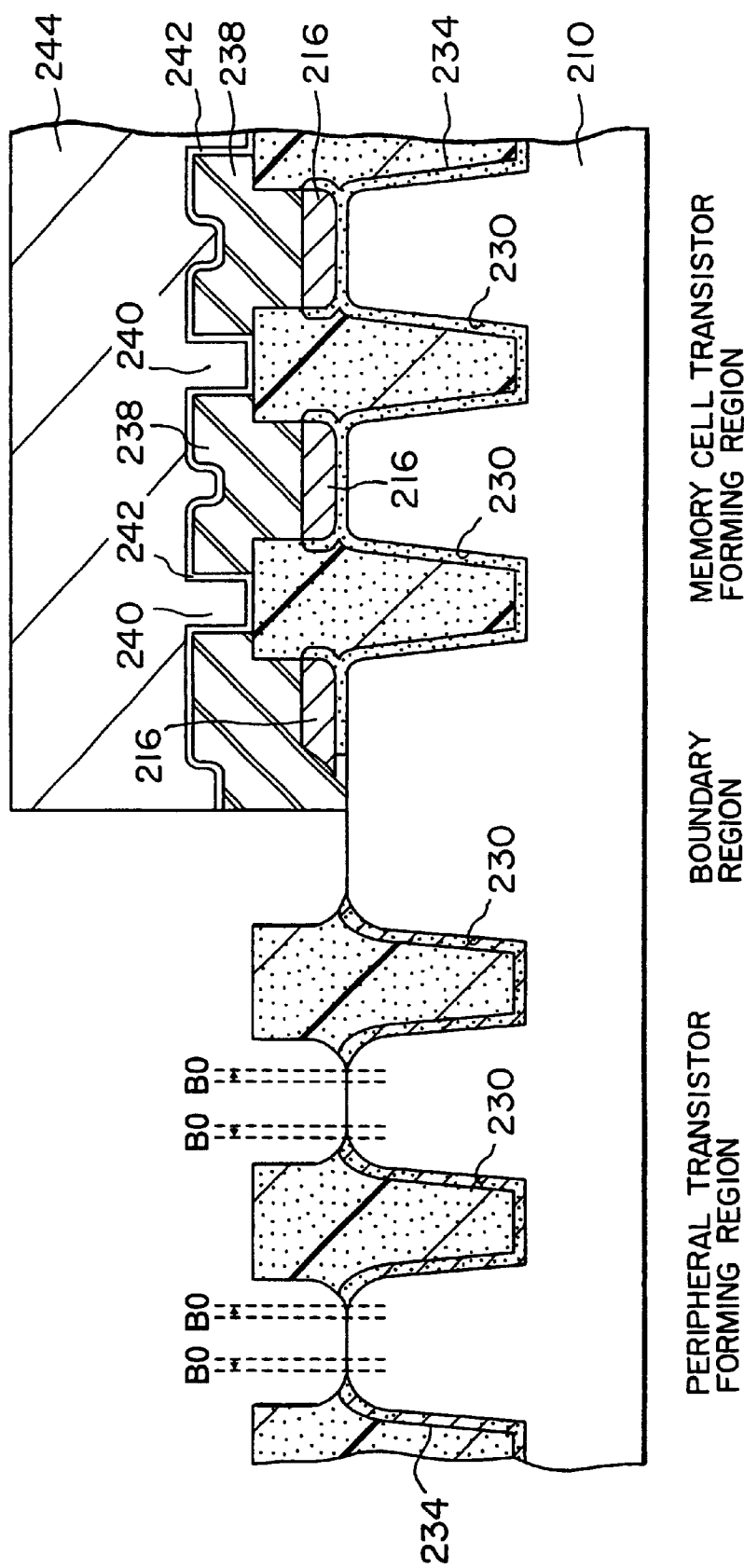
FIG. 27 is a cross-sectional partial view of the nonvolatile semiconductor storage device under the manufacturing process according to the second embodiment of the invention.

Next as shown in FIG. 27, patterning is conducted by using a photoresist 244 to remove the ONO insulating film 242, third polysilicon 238 and second polysilicon 220 from the peripheral transistor forming region by dry etching. After that, the multi-layered oxide film 218 is removed by wet etching. As a result of this wet etching, STI edges in the peripheral transistor forming region retract by B0.

Figure 28:
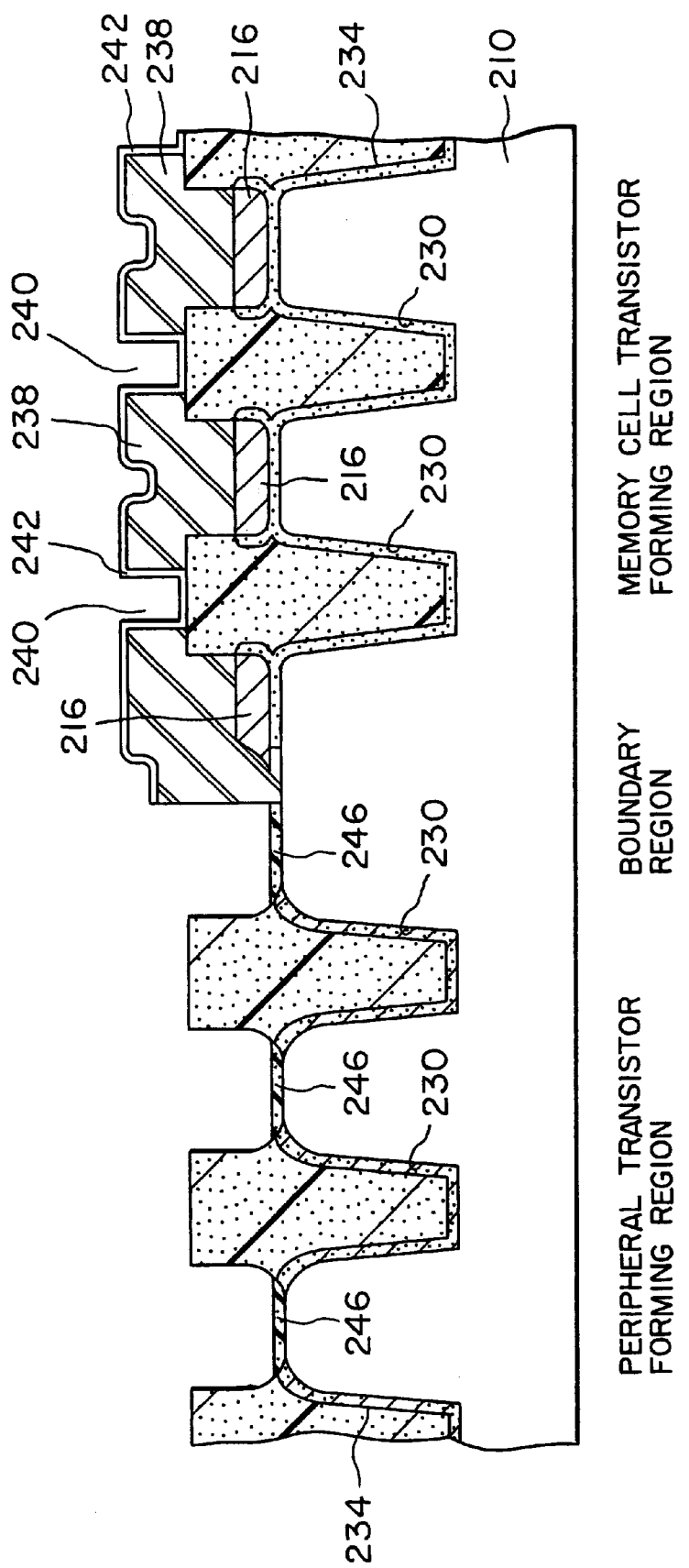
FIG. 28 is a cross-sectional partial view of the nonvolatile semiconductor storage device under the manufacturing process according to the second embodiment of the invention.

The photoresist 244 is removed thereafter as shown in FIG. 28. After that, a first peripheral gate oxide film 246 is formed in both the high voltage-withstanding region and the low voltage-withstanding region of the peripheral transistor forming region. The high voltage-withstanding region of the peripheral transistor forming region is the site for a transistor having a thick gate oxide film whereas the low voltage-withstanding region of the peripheral transistor forming region is the site for a transistor having a thin gate oxide film. Therefore, the first peripheral gate oxide film 246 formed in the high voltage-withstanding region finally forms a thick gate oxide film. In this embodiment, the first peripheral gate oxide film 246 is stacked up to the thickness of 12 nm through 15 nm, for example. In the process of forming the first peripheral gate oxide film 246, the third polysilicon (floating gate FG) 238 in the memory cell transistor forming region is protected from oxidation by the ONO film 242 so that the third polysilicon is not oxidized.

Figure 29:
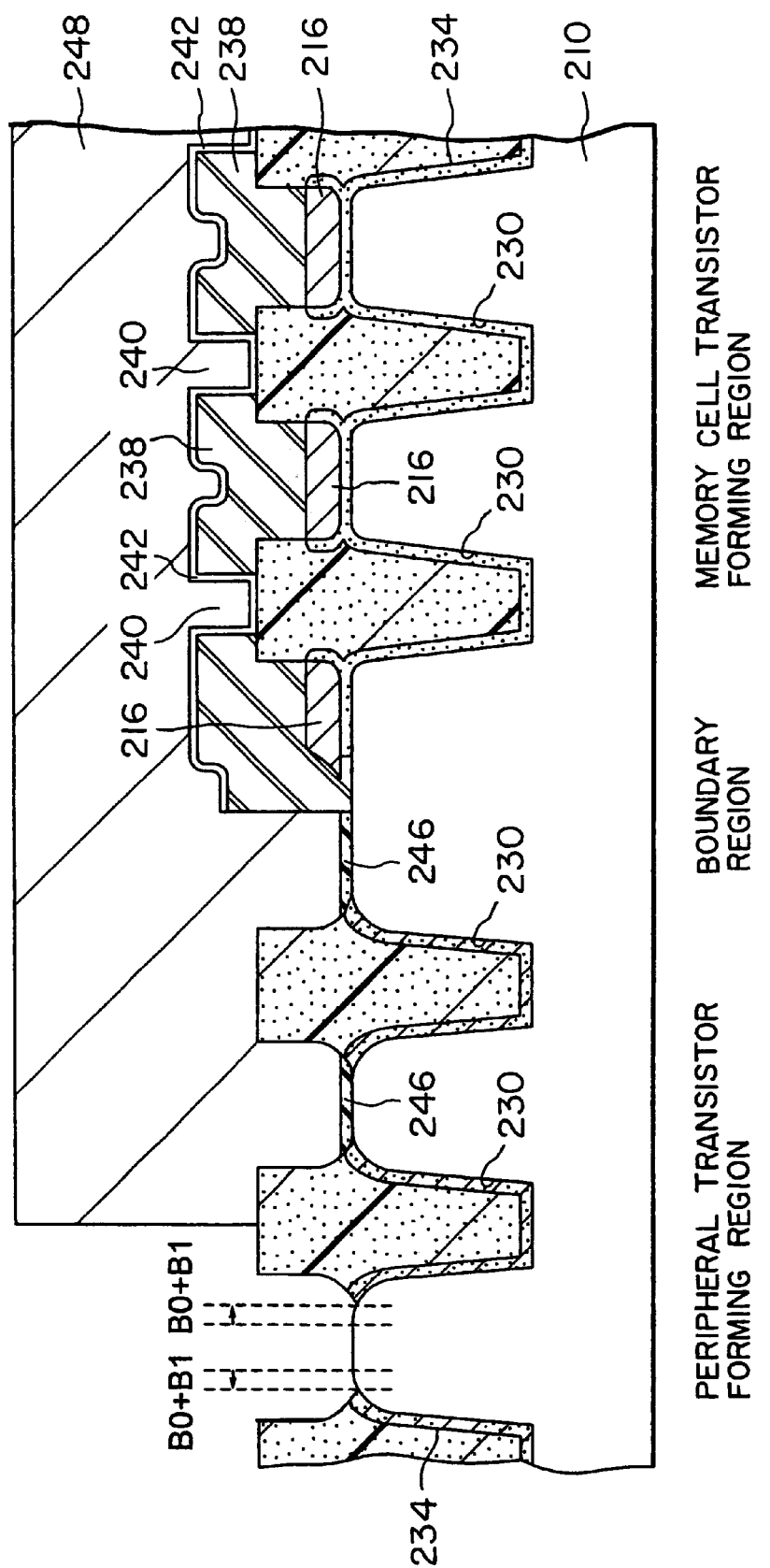
FIG. 29 is a cross-sectional partial view of the nonvolatile semiconductor storage device under the manufacturing process according to the second embodiment of the invention.

Next as shown in FIG. 29, a photo resist 248 is formed to cover the memory cell transistor forming region and the high voltage-withstanding region of the peripheral transistor forming region. That is, after the photo resist 248 is coated, an aperture is formed in the photoresist 248 in the low voltage-withstanding region where the thin gate oxide film should be made. Subsequently, while maintaining the photoresist 248, wet processing is conducted to remove the first peripheral gate oxide film 246. As a result of this wet processing, STI edges further retract by B1 in the low voltage-withstanding region. That is, STI edges retract by B0+B1 in total from the aspect shown in FIG. 27.

Figure 30:
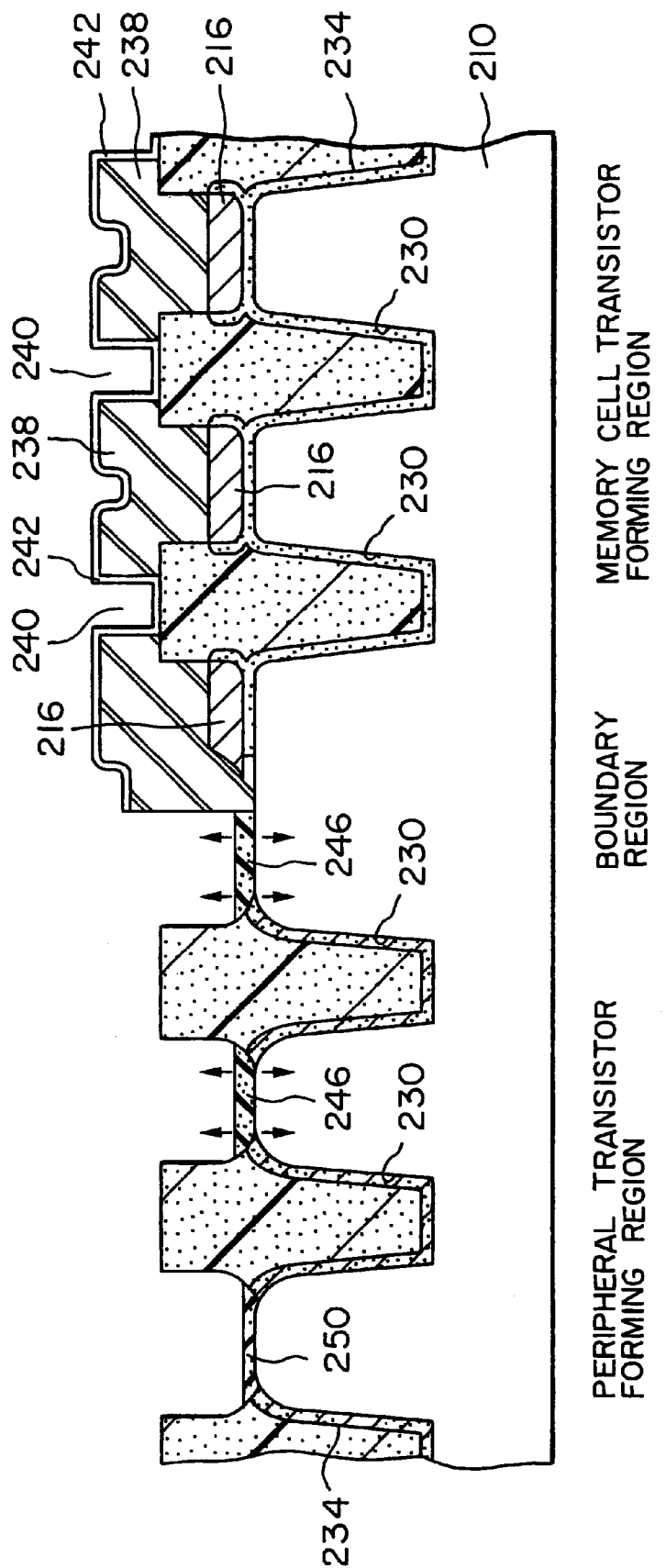
FIG. 30 is a cross-sectional partial view of the nonvolatile semiconductor storage device under the manufacturing process according to the second embodiment of the invention.

The photoresist 248 is removed thereafter as shown in FIG. 30. After that, a second peripheral gate oxide film 250 is formed. In this embodiment, the second peripheral gate oxide film 250 is stacked up to the thickness of 4 nm through 6 nm. The second peripheral gate oxide film 250 is used as the thin gate oxide film. In the process of making the second peripheral gate oxide film 250, the first peripheral gate oxide film 246 of the high voltage-withstanding region is additionally oxidized. Therefore, the first peripheral gate oxide film 246 grows to be thicker than its original thickness.

Next as shown in FIG. 31, fourth polysilicon 252 is formed all over the semiconductor substrate 210 including the ONO film 242, first peripheral gate oxide film 246 and second peripheral gate oxide film 250. The fourth polysilicon 252 is a film finally constituting the control gate (CG) of the memory cell transistor and the gate electrode (GE) of the peripheral transistor.

Figure 32:
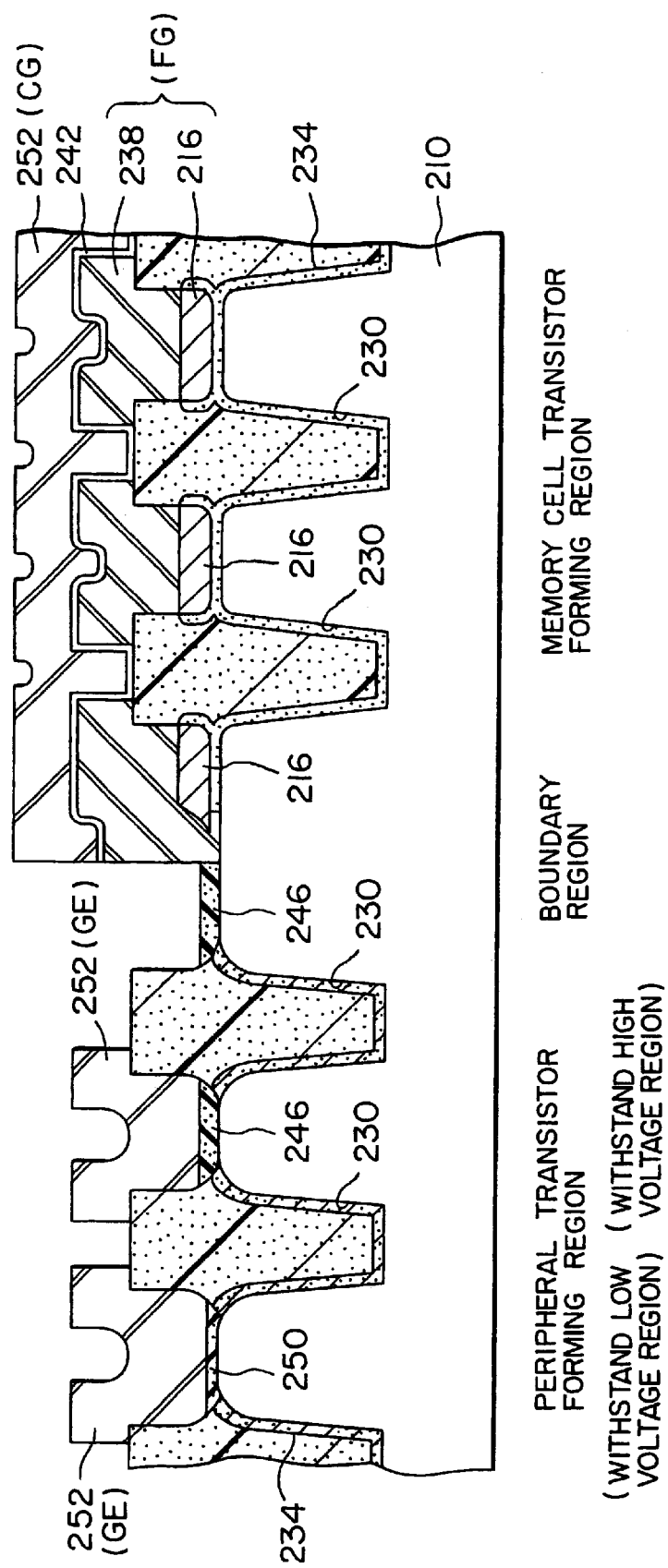
FIG. 32 is a cross-sectional partial view of the nonvolatile semiconductor storage device under the manufacturing process according to the second embodiment of the invention.

Next as shown in FIG. 32, the fourth polysilicon 252 is patterned. That is, a slit continuously extending in the word line direction is formed. As a result, the floating gate FG and the control gate CG are formed. Additionally, by separating the fourth polysilicon 252 in the peripheral transistor forming region for individual transistors, the gate electrodes GE are formed.

After that, ion implantation is conducted to form a diffusion layer required to make the memory cell transistor and the peripheral transistor. Subsequently, impurities are introduced into the high-concentrated diffusion layer and the gate polysilicon. In this case, As (arsenic) is introduced into the N-type MOS transistor forming region, and B (boron) into the P-type OS transistor forming region. Thereafter, by forming a wiring layer by a typical silicide process and finally forming a passivation layer, the LSI manufacturing process according to the embodiment is finished.

As explained above, since the manufacturing process of a nonvolatile semiconductor storage device according to the embodiment is configured to make bird's beaks bite in between the second polysilicon 220 and the active region of the semiconductor substrate 210 as shown in FIG. 23 so that the third oxide film 234 enters into the polysilicon 220, the gate electrodes GE can be prevented from falling at STI edges as shown in FIG. 32 even when retraction at STI edges occurs as shown in FIGS. 27 and 29.

More specifically, as shown in FIG. 27, retraction of B0 occurs at STI edges in the high voltage-withstanding region of the peripheral transistor forming region, and retraction of B0+B1 occurs at STI edges in the low voltage-withstanding region as shown in FIG. 29. In this embodiment, previously estimating these amounts of retraction, B0 and B0+B1, the third oxide film 234 is formed to enter into the gate insulating film forming region by making bird's beaks as shown in FIG. 23. Therefore, even when STI edges retract by B0 upon removal of the multi-layered oxide film 218 by wet etching as shown in FIGS. 26 and 27, the first peripheral gate oxide film 246 can be made not to fall down from the level of the active region of the semiconductor substrate 210 as shown in FIG. 28. Additionally, even when STI edges further retract by B1 upon removal of the first peripheral gate oxide film 246 as shown in FIGS. 28 and 29, the second peripheral gate oxide film 250 can be made not fall down from the level of the active region of the semiconductor substrate 210 as shown in FIG. 30.

In this manner, the embodiment can remove the conventional problem that a kink property appears in the sub-threshold regions of memory cell transistors and the peripheral transistors due to depression or falling of STI edges from the level of the active layer.

Additionally, the biting depth of the bird's beaks upon formation of the third oxide film 234 can be readily controlled by changing the ratio in thickness between the thermal oxide film and the TEOS oxide film in the multi-layered oxide film 218. That is, the biting depth of the bird's beaks can be increased by increasing the thickness of the TEOS oxide film. In this manner, the biting depth of the bird'speaks upon rounding oxidation for making the third oxide film 234 may be controlled to prevent the STI edges from falling down even when they retract by B0+B1.

The invention is not limited to the above-explained embodiments and can be changed or modified in various modes. For example, although the first embodiment has been explained as making three kinds of oxide films different in thickness in the apertures 28A and 28B, the invention is applicable also when making oxide films of two, four and any more different thicknesses. Further, the oxide films 32, 42, 46 different in thickness as shown in the first embodiment may be other insulating films. Similarly, the oxide films 214, 246, 250 different in thickness as shown in the second embodiment may be other insulating films.

Furthermore, although the first and second embodiments have been explained as manufacturing a nonvolatile semiconductor storage device, the invention is applicable to fabrication of any semiconductor devices having a STI structure using a plurality of oxide films different in thickness.

What is claimed is:

1. A manufacturing method of a nonvolatile semiconductor storage device including a memory cell transistor forming region for forming a memory cell transistor, and a peripheral transistor forming region for forming a peripheral transistor for said memory cell transistor, comprising the steps of:

making on a semiconductor substrate a first pattern mask having an aperture in a trench isolation forming region;

making an isolation aperture in said semiconductor substrate by using said first pattern mask;

narrowing the width of said first pattern mask to form a second pattern mask having a first mask with a first width in said memory cell transistor forming region and a second mask with a second width narrower than said first width in said peripheral transistor forming region;

forming a buried insulating film which buries said isolation aperture and extends onto said pattern mask;

removing said second pattern mask, then making a first aperture with said first width in a portion of said buried insulating film located in said memory cell transistor forming region, from which said first mask has been removed, and making a second aperture with said second width in a portion of said buried insulating film located in said peripheral transistor forming region, from which said second mask has been removed;

forming a first insulating film with a first thickness on the bottom surface of said first aperture located in said memory cell transistor forming region and the bottom surface of said second aperture located in said peripheral transistor forming region;

removing said first insulating film formed on the bottom surface of said second aperture located in said peripheral transistor forming region while maintaining said first insulating film formed on the bottom surface of said first aperture located in said memory cell transistor forming region;

forming a second insulating film different in thickness from said first insulating film on the bottom surface of said second aperture located in said peripheral transistor forming region;

removing said second insulating film formed on the bottom surface of said second aperture located in a low voltage-withstanding transistor forming region of said peripheral transistor forming region for forming a low voltage-withstanding transistor while maintaining said first insulating film formed on the bottom surface of said first aperture located in said memory cell transistor forming region and said second insulating film formed on the bottom surface of said second aperture located in a high voltage-withstanding transistor forming region of said peripheral transistor forming region for forming a high voltage-withstanding transistor; and forming a third insulating film on the bottom surface of said second aperture located in said low voltage-withstanding transistor forming region, said third insulating film having a thickness different from the thickness of said first insulating film and different from the thickness of said second insulating film located in said high voltage-withstanding transistor forming region.

2. The manufacturing method of a nonvolatile semiconductor storage device according to claim 1 wherein the step of forming said second pattern mask includes the step of:

forming said first mask with said first width by reducing the width of said first pattern mask located in said memory cell transistor forming region and said peripheral transistor forming region by a predetermined amount; and forming said second mask with said second width in said peripheral transistor forming region by further reducing the width of said first mask located in said peripheral transistor forming region while continuously covering said memory cell transistor forming region.

3. The manufacturing method of a nonvolatile semiconductor storage device according to claim 2 wherein the step of covering said memory cell transistor forming region in the step of forming said second mask includes the steps of:

forming a fourth insulating film on said semiconductor substrate;

forming a photoresist pattern in said memory cell transistor forming region on said fourth insulating film;

removing said fourth insulating film from said peripheral transistor forming region by using said photoresist pattern while maintaining said fourth insulating film in said memory cell transistor forming region; and removing said photoresist pattern.

4. The manufacturing method of a nonvolatile semiconductor storage device according to claim 3 wherein said first insulating film, said second insulating film and said third insulting film are different in thickness, said third insulating film being the thinnest, said second insulating film being the thickest.

5. A manufacturing method of a nonvolatile semiconductor storage device including a memory cell transistor forming region for forming a memory cell transistor, and a peripheral transistor forming region for forming a peripheral transistor for said memory cell transistor, comprising the steps of:

forming a tunnel oxide film on a semiconductor substrate in said memory transistor forming region;

forming a first oxide film on said semiconductor substrate in said peripheral transistor forming region;

making an aperture in each trench isolation forming region in said tunnel oxide film, said first oxide film and a surface side of said semiconductor substrate to use the surface side of said semiconductor substrate located between apertures as an active region;

conducting rounding oxidation of said semiconductor substrate to make bird's beaks which bite at least into said first oxide film portion located in said active region;

burying a buried oxide film in said aperture in each said trench isolation forming region in said memory cell transistor forming region and said peripheral transistor forming region to make trench isolation; and removing said first oxide film from said active region in said peripheral transistor forming region.

6. The manufacturing method of a nonvolatile semiconductor storage device according to claim 5 further comprising the steps of:

forming a first gate oxide film on said active region in said peripheral transistor forming region from which said first oxide film has been removed;

removing said first gate oxide film from a low voltage-withstanding transistor forming region for making a low voltage-withstanding transistor in said peripheral transistor forming region; and forming a second gate oxide film on said active region in said low voltage-withstanding transistor forming region from which said first gate oxide film has been removed, and simultaneously growing said first gate oxide film thicker in a high voltage-withstanding transistor forming region for making a high voltage-withstanding transistor in said peripheral transistor forming region.

7. The manufacturing method of a nonvolatile semiconductor storage device according to claim 6 wherein the step of forming said first oxide film includes the steps of:

forming a second oxide film by thermal oxidation; and forming a third oxide film by CVD using $Si(OC_2H_5)_4$.

8. The manufacturing method of a nonvolatile semiconductor storage device according to claim 7 wherein the biting depth of said bird's beaks is controlled by changing the ratio in thickness between said second oxide film and said third oxide film in said first oxide film.

9. The manufacturing method of a nonvolatile semiconductor storage device according to claim 8 wherein the biting depth of said bird's beaks is controlled to be larger than the sum of the reduced amount of said active region made upon removal of said first oxide film and the reduced amount of said active region made upon removal of said first gate oxide film.

10. The manufacturing method of a nonvolatile semiconductor storage device according to claim 9 further comprising the steps of:

forming a gate electrode on said first gate oxide film in said high voltage-withstanding transistor forming region to make a high voltage-withstanding transistor; and forming a gate electrode on said second gate oxide film in said low voltage-withstanding transistor forming region to make a low voltage-withstanding transistor.

11. The manufacturing method of a nonvolatile semiconductor storage device according to claim 10 wherein said tunnel oxide film, said first gate oxide film and said second gate oxide film are different in thickness, said second gate oxide film being the thinnest, said first gate oxide film being the thickest.

* * * * *